(12) United States Patent
Chester et al.

(10) Patent No.: US 10,306,804 B2
(45) Date of Patent: May 28, 2019

(54) COOLED ELECTRONIC SYSTEM

(71) Applicant: Iceotope Limited, St Peter Port (GG)

(72) Inventors: Daniel Chester, Staffordshire (GB);
Peter Hopton, South Yorkshire (GB);
Jason Bent, Shropshire (GB); Keith Deakin, South Yorkshire (GB)

(73) Assignee: Iceotope Limited, St. Peter Port (GG)

(*) Notice: Subject to any disclaimer, the term of this patent is extended or adjusted under 35 U.S.C. 154(b) by 0 days.

(21) Appl. No.: 15/179,257

(22) Filed: Jun. 10, 2016

(65) Prior Publication Data
US 2016/0286693 A1 Sep. 29, 2016

Related U.S. Application Data

(63) Continuation of application No. 13/781,876, filed on Mar. 1, 2013, now Pat. No. 9,392,727, which is a
(Continued)

(51) Int. Cl.
*H05K 7/20* (2006.01)
*G06F 1/20* (2006.01)
(Continued)

(52) U.S. Cl.
CPC .......... *H05K 7/20281* (2013.01); *B65B 7/00* (2013.01); *B65B 63/08* (2013.01); *F25D 23/12* (2013.01);
(Continued)

(58) Field of Classification Search
CPC .... H05K 7/20; H05K 7/20263; H05K 7/2039; H05K 7/20236; H05K 7/20772;
(Continued)

(56) References Cited

U.S. PATENT DOCUMENTS 3,200,881 A  8/1965 Bucks et al.
3,481,393 A * 12/1969 Chu .................. F28F 3/12
                                              165/104.31
(Continued)

FOREIGN PATENT DOCUMENTS

CN   1632718 A   6/2005
DE   1201297 B   9/1965
(Continued)

OTHER PUBLICATIONS

Japanese Office Action and English language translation in Application No. 2012-510362, dated Sep. 2, 2014.
(Continued)

*Primary Examiner* — Anatoly Vortman
(74) *Attorney, Agent, or Firm* — Morris & Kamlay LLP

(57) ABSTRACT

A sealable module, cooled electronic system and method are described relating to cooling a heat generating electronic device. The sealable module is adapted to be filled with a first cooling liquid and a heat transfer device having a conduction surface defines a channel for receiving a second cooling liquid. In one embodiment, at least a portion of the conduction surface or housing is shaped in conformity with the shape of the electronic component. Control of the second cooling liquid is also described. Transferring heat between the second cooling liquid and a third cooling liquid features in embodiments. A method of filling a container with a cooling liquid is further detailed.

28 Claims, 17 Drawing Sheets

Related U.S. Application Data continuation-in-part of application No. 13/746,505, filed on Jan. 22, 2013, now Pat. No. 9,516,791, which is a continuation of application No. 12/778,049, filed on May 11, 2010, now Pat. No. 8,369,090.

(60) Provisional application No. 61/177,548, filed on May 12, 2009.

(51) Int. Cl.
| | | |
|---|---|---|
| *F25D 23/12* | (2006.01) | |
| *H01L 23/473* | (2006.01) | |
| *H05K 13/00* | (2006.01) | |
| *B65B 7/00* | (2006.01) | |
| *B65B 63/08* | (2006.01) | |

(52) U.S. Cl.
CPC .............. *G06F 1/20* (2013.01); *H01L 23/473* (2013.01); *H05K 7/20* (2013.01); *H05K 7/2039* (2013.01); *H05K 7/20218* (2013.01); *H05K 7/20236* (2013.01); *H05K 7/20263* (2013.01); *H05K 7/20509* (2013.01); *H05K 7/20763* (2013.01); *H05K 7/20772* (2013.01); *H05K 7/20781* (2013.01); *H05K 13/00* (2013.01); *G06F 2200/201* (2013.01); *Y10T 29/49002* (2015.01); *Y10T 29/4935* (2015.01)

(58) Field of Classification Search
CPC .............. H05K 13/00; H05K 7/20509; H05K 7/20763; G06F 1/20; F25D 23/12; H01L 23/473; H01L 23/476; Y10T 29/49002; Y10T 29/4935
USPC ...... 361/679.46, 679.53, 688, 689, 698, 699, 361/700, 714, 715; 165/80.4, 80.5, 80.2, 165/104.33, 75, 77, 47, 53; 257/714; 62/259.2
See application file for complete search history.

(56) References Cited

U.S. PATENT DOCUMENTS

| | | | |
|---|---|---|---|
| 3,512,582 | A | 5/1970 | Chu et al. |
| 3,524,497 | A | 8/1970 | Gupta et al. |
| 4,203,129 | A | 5/1980 | Oktay et al. |
| 4,448,240 | A | 5/1984 | Sharon et al. |
| 4,468,717 | A | 8/1984 | Mathias et al. |
| 4,479,140 | A | 10/1984 | Horvath |
| 4,485,429 | A | 11/1984 | Mittal et al. |
| 4,493,010 | A | 1/1985 | Morrison et al. |
| 4,551,787 | A | 11/1985 | Solis et al. |
| 4,686,606 | A | 8/1987 | Yamada et al. |
| 4,704,658 | A | 11/1987 | Yokouchi et al. |
| 4,729,424 | A | 3/1988 | Mizuno et al. |
| 4,748,495 | A | 5/1988 | Kucharek |
| 4,765,397 | A | 8/1988 | Chrysler et al. |
| 4,865,123 | A | 9/1989 | Kawashima et al. |
| 4,928,207 | A | 5/1990 | Chrysler et al. |
| 4,942,497 | A | 7/1990 | Mine et al. |
| 5,006,924 | A | 4/1991 | Frankeny et al. |
| 5,021,924 | A | 6/1991 | Kieda et al. |
| 5,023,695 | A | 6/1991 | Umezawa et al. |
| 5,036,384 | A | 7/1991 | Umezawah et al. |
| 5,052,472 | A | 10/1991 | Senshu et al. |
| 5,144,531 | A | 9/1992 | Go et al. |
| 5,170,319 | A | 12/1992 | Chao-Fan et al. |
| 5,239,200 | A | 8/1993 | Messina et al. |
| 5,264,984 | A | 11/1993 | Akamatsu et al. |
| 5,270,572 | A | 12/1993 | Nakajima et al. |
| 5,271,239 | A | 12/1993 | Rockenfeller et al. |
| 5,305,184 | A | 4/1994 | Andersen et al. |
| 5,345,107 | A | 9/1994 | Daikoku et al. |
| 5,375,650 | A | 12/1994 | Mizuno |
| 5,396,775 | A | 3/1995 | Rockenfeller et al. |
| 5,455,458 | A | 10/1995 | Quon et al. |
| 5,680,294 | A | 10/1997 | Stora et al. |
| 5,774,334 | A | 6/1998 | Kawamura et al. |
| 5,812,372 | A | 9/1998 | Galyon et al. |
| 5,943,211 | A | 8/1999 | Havey et al. |
| 5,959,351 | A | 9/1999 | Sasaki et al. |
| 6,016,251 | A | 1/2000 | Koide et al. |
| 6,029,742 | A * | 2/2000 | Burward-Hoy ....... F28D 1/0325 165/80.3 |
| 6,052,284 | A | 4/2000 | Suga et al. |
| 6,105,662 | A | 8/2000 | Suzuki |
| 6,111,749 | A | 8/2000 | Lamb et al. |
| 6,154,369 | A | 11/2000 | Martinez et al. |
| 6,166,907 | A * | 12/2000 | Chien ................... F28D 1/0478 165/104.33 |
| 6,170,270 | B1 | 1/2001 | Arshansky et al. |
| 6,173,759 | B1 | 1/2001 | Galyon et al. |
| 6,182,742 | B1 | 2/2001 | Takahashi et al. |
| 6,192,701 | B1 | 2/2001 | Goth et al. |
| 6,193,905 | B1 | 2/2001 | Yamada et al. |
| 6,213,194 | B1 | 4/2001 | Chrysler et al. |
| 6,243,268 | B1 | 6/2001 | Kang et al. |
| 6,273,186 | B1 | 8/2001 | Ognibene et al. |
| 6,389,225 | B1 | 5/2002 | Malinoski et al. |
| 6,457,228 | B1 | 10/2002 | Arai et al. |
| 6,496,366 | B1 | 12/2002 | Coglitore et al. |
| 6,510,053 | B1 | 1/2003 | Azar et al. |
| 6,634,421 | B2 | 10/2003 | Ognibene et al. |
| 6,665,185 | B1 | 12/2003 | Kulik et al. |
| 6,754,076 | B2 * | 6/2004 | Cox ....................... F04D 13/14 165/80.4 |
| 6,778,393 | B2 | 8/2004 | Messina et al. |
| 6,828,675 | B2 * | 12/2004 | Memory ............. H05K 7/20681 165/104.33 |
| 6,850,408 | B1 | 2/2005 | Coglitore et al. |
| 6,942,018 | B2 * | 9/2005 | Goodson ............... F04B 19/006 165/104.21 |
| 6,970,355 | B2 * | 11/2005 | Ellsworth, Jr. ........ H01L 23/467 165/122 |
| 6,992,888 | B1 | 1/2006 | Iyer |
| 7,011,143 | B2 | 3/2006 | Corrado et al. |
| 7,024,573 | B2 | 4/2006 | Patel et al. |
| 7,062,934 | B2 | 6/2006 | Craps et al. |
| 7,106,590 | B2 | 9/2006 | Chu et al. |
| 7,151,668 | B1 | 12/2006 | Stathakis et al. |
| 7,184,269 | B2 | 2/2007 | Campbell et al. |
| 7,187,549 | B2 * | 3/2007 | Teneketges ........... H01L 23/473 165/104.33 |
| 7,227,749 | B2 | 6/2007 | Rockenfeller et al. |
| 7,246,940 | B2 | 7/2007 | Storm et al. |
| 7,274,566 | B2 | 9/2007 | Campbell et al. |
| 7,280,358 | B2 | 10/2007 | Malone et al. |
| 7,298,617 | B2 | 11/2007 | Campbell et al. |
| 7,305,829 | B2 | 12/2007 | Mirolli et al. |
| 7,385,817 | B2 | 6/2008 | Campbell et al. |
| 7,394,659 | B2 | 7/2008 | Colgan et al. |
| 7,403,392 | B2 | 7/2008 | Berning et al. |
| 7,414,845 | B2 | 8/2008 | Attlesey et al. |
| 7,447,026 | B2 | 11/2008 | Murakami et al. |
| 7,450,378 | B2 | 11/2008 | Nelson et al. |
| 7,484,530 | B2 | 2/2009 | Harvey et al. |
| 7,486,513 | B2 | 2/2009 | Hall et al. |
| 7,486,514 | B2 | 2/2009 | Campbell et al. |
| 7,599,184 | B2 | 10/2009 | Landry et al. |
| 7,609,519 | B2 | 10/2009 | Campbell et al. |
| 7,672,132 | B2 | 3/2010 | Fitzgerald et al. |
| 7,875,890 | B1 | 1/2011 | Goushcha et al. |
| 7,911,793 | B2 | 3/2011 | Attlesey et al. |
| 7,916,483 | B2 | 3/2011 | Campbell et al. |
| 7,978,473 | B2 | 7/2011 | Campbell et al. |
| 8,014,150 | B2 | 9/2011 | Campbell et al. |
| 8,322,154 | B2 | 12/2012 | Campbell et al. |
| 8,432,691 | B2 * | 4/2013 | Toftloekke .......... F28D 15/0266 165/104.21 |
| 2001/0034117 | A1 | 10/2001 | Eldridge et al. |
| 2004/0125562 | A1 | 7/2004 | DiStefano et al. |
| 2005/0081534 | A1 | 4/2005 | Suzuki et al. |

(56) References Cited

U.S. PATENT DOCUMENTS

| | | |
|---|---|---|
| 2005/0083655 A1 | 4/2005 | Jairazbhoy et al. |
| 2005/0128705 A1 | 6/2005 | Chu et al. |
| 2005/0157466 A1 | 7/2005 | Minamitani et al. |
| 2005/0160752 A1 | 7/2005 | Ghoshal et al. |
| 2005/0231910 A1 | 10/2005 | Malone et al. |
| 2005/0241328 A1 | 11/2005 | Craps et al. |
| 2005/0247433 A1 | 11/2005 | Corrado et al. |
| 2006/0002086 A1 | 1/2006 | Teneketges et al. |
| 2006/0126296 A1 | 6/2006 | Campbell et al. |
| 2006/0187639 A1 | 8/2006 | Carswell et al. |
| 2006/0266501 A1 | 11/2006 | So et al. |
| 2007/0034360 A1 | 2/2007 | Hall et al. |
| 2007/0042514 A1 | 2/2007 | Wu et al. |
| 2007/0109742 A1 | 5/2007 | Hopton et al. |
| 2007/0121299 A1 | 5/2007 | Campbell et al. |
| 2007/0133171 A1 | 6/2007 | Cheon |
| 2007/0201204 A1 | 8/2007 | Upadhya et al. |
| 2007/0201210 A1 | 8/2007 | Chow et al. |
| 2007/0209782 A1 | 9/2007 | Wyatt et al. |
| 2007/0227703 A1 | 10/2007 | Bhatti et al. |
| 2007/0227710 A1 | 10/2007 | Belady et al. |
| 2007/0267188 A1 | 11/2007 | Di Stefano et al. |
| 2007/0267741 A1 | 11/2007 | Attlesey et al. |
| 2007/0268669 A1 | 11/2007 | Attlesey et al. |
| 2007/0291452 A1 | 12/2007 | Gilliland et al. |
| 2008/0017355 A1 | 1/2008 | Attlesey et al. |
| 2008/0196868 A1 | 8/2008 | Attlesey et al. |
| 2008/0196870 A1 | 8/2008 | Attlesey et al. |
| 2008/0212282 A1 | 9/2008 | Hall et al. |
| 2008/0273303 A1 | 11/2008 | Pal |
| 2009/0071636 A1 | 3/2009 | Novotny et al. |
| 2009/0188659 A1 | 7/2009 | Delia et al. |
| 2009/0260777 A1 | 10/2009 | Attlesey et al. |
| 2013/0021752 A1 | 1/2013 | Campbell et al. |

FOREIGN PATENT DOCUMENTS

| | | |
|---|---|---|
| DE | 2042866 A1 | 3/1972 |
| DE | 10201557 A1 | 7/2003 |
| DE | 10360401 A1 | 7/2004 |
| DE | 202005000007 U1 | 4/2005 |
| DE | 102006004189 A1 | 9/2006 |
| DE | 102005006764 A1 | 10/2006 |
| EP | 0068142 A2 | 1/1983 |
| EP | 0151546 A2 | 8/1985 |
| EP | 1970647 A2 | 9/2008 |
| GB | 2124036 A | 2/1984 |
| GB | 2349985 A | 11/2000 |
| GB | 2389174 A | 12/2003 |
| GB | 2449143 A | 11/2008 |
| JP | 55035174 B | 3/1980 |
| JP | S6285449 | 4/1987 |
| JP | 01318295 A | 12/1989 |
| JP | 0273698 | 3/1990 |
| JP | 02067792 U | 5/1990 |
| JP | 04226057 | 8/1992 |
| JP | 08172285 A | 7/1996 |
| JP | 09064257 A | 3/1997 |
| JP | 11121668 | 4/1999 |
| JP | 2000349213 A | 12/2000 |
| JP | 2001102835 A | 4/2001 |
| JP | 2007258624 | 4/2007 |
| JP | 4233798 B2 | 3/2009 |
| KR | 1020040073983 A | 8/2004 |
| TW | 243638 | 11/2005 |
| WO | 9106958 A1 | 5/1991 |
| WO | 9722980 A1 | 6/1997 |
| WO | 2010130993 A2 | 11/2010 |

OTHER PUBLICATIONS

International Preliminary Report on Patentability and Written Opinion for PCT/GB2010/000950, dated Nov. 15, 2011, 12 pages, dated Nov. 15, 2011, pp. 12.

International Search Report for PCT/GB2010/000950, dated Mar. 9, 2011, 5 pages, Mar. 9, 2011, pp. 5.

"European Examination Report", European Examination Report dated Apr. 18, 2013 in corresponding European Application No. 10 722 744.9.

"ISR", International Search Report and Written Opinion dated Jul. 7, 2014 in corresponding International Application No. PCT/GB2014/050616.

"Notification of the First Office Action", Notification of the First Office Action issued in corresponding Chinese Application No. 201080031498.8 dated Mar. 20, 2014.

"Search Report", Search Report dated Jul. 22, 2013 in corresponding Application No. GB 1303643.9.

* cited by examiner

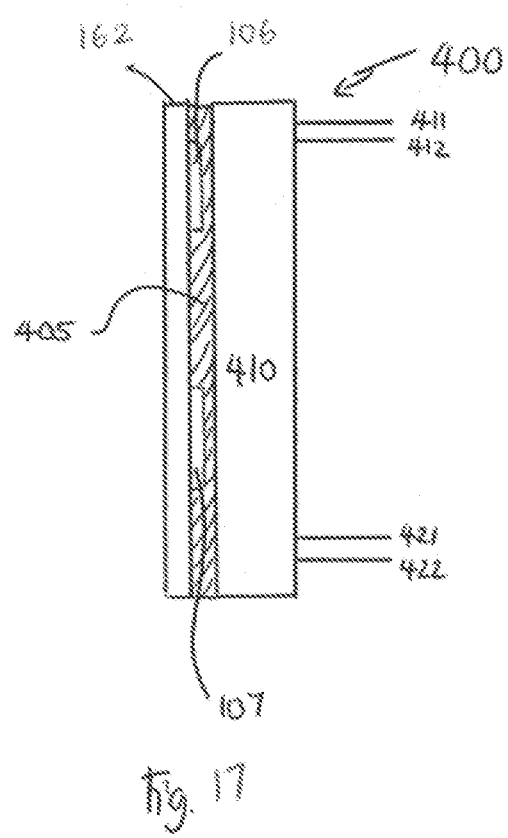

COOLED ELECTRONIC SYSTEM

TECHNICAL FIELD OF THE INVENTION

This invention relates to a module or capsule for housing an electronic component that generates heat in operation, a method of cooling such an electronic component, a method of cooling an electronic device, a cooled electronic system, and a method of filling a container for an electronic device with a cooling liquid. The invention is particularly applicable, for example, to computer processors and motherboards.

BACKGROUND TO THE INVENTION

Electronic components and in particular computer processors generate heat in operation, which can lead to overheating and consequent damage to the component and other parts of the system. It is therefore desirable to cool the component to transfer the heat away from the component and maintain the component temperature below the maximum operating temperature that is specified for correct and reliable operation of the component.

This issue especially concerns data processing or computer server centres, where a substantial number of computer processors are co-located and intended for reliable, continuous operation over a long time period. These centres may typically contain many server units, occupying multiple equipment racks and filling one or more rooms. Each server unit contains one or more server board. A single server board can dissipate many hundreds of watts of electrical power as heat. In existing systems, the energy required to transfer heat continuously so as to maintain correct operation can be of the same order of magnitude as the energy required to operate the servers.

The heat generated can be transferred to a final heat sink external to the building in which the processors are located, for example to the atmospheric air surrounding the building. Current implementations typically rely on air as the transfer medium at one or more stages between the processors and the final heat sink.

However, it is difficult to use air as a transfer medium for such a large quantity of heat, without imposing significant limitations on the building infrastructure. This is because the rate at which heat can be transferred increases with: increasing temperature difference ($\Delta T$) between the heat source (such as the server boards, in particular the computer processors) and final heat sink; and decreasing thermal resistance of the path or paths thermally connecting the heat source and final heat sink.

Some known technologies for dealing with this difficulty are designed to control the environmental conditions of the location at which the processors are housed. Air handling techniques are currently often used, for example: vapour-compression refrigeration ("air conditioning") of the air that reduces the local air temperature to increase the local temperature difference; and air pressurisation (by the use of fans) to increase the air flow rate and thereby reduce the thermal resistance. Further heat exchange stages may be used to transfer heat extracted from the local air to a final heat sink, such as atmospheric air.

However, these approaches can be inefficient, as the use of air conditioning can require substantial amounts of electrical power to operate. These approaches can also make the location unpleasant for people, due to the local temperature and noise.

Furthermore, air flow rates and air temperatures may have to be limited, for example maintaining temperature above the "dew point" to prevent water vapour condensing out of air that may damage sensitive electronic components. For these reasons, servers are currently commonly distributed sparsely in order to reduce the heat density and improve local air flow, thereby reducing the thermal resistance.

Cooling the electronic components using a liquid that is brought into contact with the electronic components can be used to increase server density, reduce cooling costs or both.

An existing technique for cooling electronic components using a liquid is described in US-2007/109742 and GB-A-2432460. A computer processor board is housed inside an airtight container. A coolant liquid, preferably oil, is pumped through the container. The processor board is located at the bottom of the container and an evaporator coil is positioned at the top of the container, such that convection currents are produced in the coolant liquid. The coolant liquid is heated by the processor board and resultant vapour flows into a condenser. The container is positioned such that the circuit board inside lies in a horizontal plane to allow convection of heat from the components.

Using a condenser to provide refrigeration increases the complexity and cost of the system, and introduces further limitations on the system implementation.

WO-2006/133429 and US-2007/034360 describe an alternative known approach for cooling electronic components. The electronic component is sealed inside a container filled with a liquid and a thermally conductive plate is provided as part of the container in contact with the liquid. The thermally conductive plate conducts heat from the liquid to the outside of the container. Although this is designed for independent operation, the thermally conductive plate can be coupled to a further heat exchanger for additional cooling of the electronic component.

This alternative arrangement reduces the complexity of the system in comparison with approaches requiring pumped fluids inside the container. However, this does not significantly address the difficulty in reducing the thermal resistance between the heat source and the final heat sink. Even if the temperature difference is increased, the total thermal resistance will still be significant.

SUMMARY OF THE INVENTION

Against this background and in a first aspect, there is provided a sealable module for containing one or more heat generating electronic components. The module comprises: a housing; a heat transfer device having a conduction surface, the housing and the conduction surface together defining a volume in which a first cooling liquid can be located, the heat transfer device further defining a channel for receiving a second cooling liquid, the conduction surface separating the volume and the channel to allow conduction of heat between the volume and the channel through the conduction surface; and an electronic component located in the volume. At least a portion of the conduction surface or housing is shaped in conformity with the shape of the electronic component.

By conforming the shape of the housing, the conduction surface or both to the shape of the electronic component, the efficiency of heat transfer between the first cooling liquid and second cooling liquid is significantly increased. This makes it possible to maintain the first cooling liquid in a liquid state up to a high level of heat output from the electronic component.

In the preferred embodiment, the sealable module further comprises at least one electronic component which generates heat when in use, and a first cooling liquid, located in the volume.

The second liquid coolant is caused to flow in the channel in direct contact with the conduction surface. The second liquid coolant is preferably pumped. Transferring heat by conduction from a first cooling liquid in the volume to the second cooling liquid in the channel reduces the thermal resistance significantly. This increases the efficiency of heat transfer, making such a system scalable and applicable to systems which generate large quantities of heat, such as data processing centres. Moreover, the reduced thermal resistance of this system gained by using a conduction surface to transfer heat allows the coolant to be maintained in a liquid state at all times, thereby avoiding the need for vapour-cycle refrigeration that increases the complexity and cost of the system.

Also, the electricity consumption for cooling is reduced by mitigating or even eliminating the need for vapour-compression refrigeration. This also allows the density of electronic components and electronic circuit boards, such as server boards, to be increased.

For a given density of servers and components, a cooling system desirably removes sufficient heat from each component to keep it within its intended operating temperature range, but no more than that. Devices that generate less heat need less cooling than those that generate larger amounts. Cooling below a level necessary for satisfactory operation will normally consume unnecessary additional energy and is therefore less than optimally efficient.

Beneficially, the channel has an area of contact with the conduction surface defining a channel width, and wherein the minimum channel width is significant in comparison with the dimensions of the conduction surface.

Additionally or alternatively, the channel interfaces with the conduction surface along a path having at least one change in direction. Preferably, the path has a straight portion, and wherein the minimum channel width is at least 10% of the length of the straight portion of the path. In other embodiments, the minimum channel width may be at least: 10%; 20%; 30%; 40%; or 50% of the length of the straight portion of the path. Additionally or alternatively, the path comprises a main path and a branch path, the branch path being connected to the main path at at least one point. More turbulent flow of liquid can improve heat transfer.

In a second aspect, there is provided a method of cooling an electronic component, comprising: providing a module comprising a housing and a heat transfer device having a conduction surface, the housing and the conduction surface together defining a volume; housing the electronic component within the volume; filling the volume with a first cooling liquid; and conducting heat between the first cooling liquid and a second cooling liquid through the conduction surface, the first cooling liquid and second cooling liquid being located on either side of the conduction surface. At least a portion of the conduction surface or housing is shaped in conformity with the shape of the electronic component.

Preferably, the step of conducting heat from the first cooling liquid to a second cooling liquid is configured such that the first cooling liquid and second cooling liquid remain in liquid state.

In a third aspect, there may be provided sealable module kit, comprising: a housing; a heat transfer device having a conduction surface, the heat transfer device being configured to couple to the housing such that the conduction surface and housing define a volume in which a first cooling liquid can be located, the heat transfer device further defining a channel for receiving a second cooling liquid such that when the heat transfer device is coupled to the housing, the conduction surface separates the volume and the channel to allow conduction of heat between the volume and the channel through the conduction surface; and an electronic component for location in the volume. At least a portion of the conduction surface or housing is shaped in conformity with the shape of the electronic component.

A number of additional features can be applied as specified by any one of the first, second or third aspects specified above. These will be described below.

Beneficially, the conduction surface has at least one projection into the first volume for conducting heat between the volume and the channel. The use of at least one projection increases the surface area of the conduction surface and can allow closer conformity between the conduction surface and the shape of the electronic component. These improve the efficiency of heat conduction.

Where the sealable module includes the electronic component, the conduction surface preferably has at least one projection into the first volume for conducting heat between the volume and the channel, the at least one projection being arranged in conformity with the shape of the electronic component. This further improves heat conduction efficiency, by: reducing the space between the component and the conduction surface; increasing total projection surface area to reduce thermal resistance in the heat flow path; reducing the volume of cooling liquid required for efficient cooling; permitting the increased use of materials with poorer conductivity but reduced cost or weight or both (e.g. plastic). In particular, efficiency of cooling is improved if the cooling liquid comes quickly into contact with the conduction surface.

Optionally, the conduction surface is made from a synthetic plastic material, which is desirably thermally conductive. Additionally or alternatively, the housing may be made from a synthetic plastic material. Preferably, this is thermally insulating. In embodiments, the heat transfer device may be made from a synthetic plastic material.

In some embodiments, the sealable module further comprises a component heat sink coupled to the electronic component, having at least one projection arranged to cooperate with the at least one projection of the conduction surface.

Advantageously, the at least one projection of the conduction surface comprises a fin arrangement. Alternatively or additionally, the at least one projection of the conduction surface comprises a pin arrangement. In the preferred embodiment, the at least one projection comprises a pin-fin arrangement. The pin-fin projections may vary in height. Preferably, they are fin-shaped with a rectangular cross section. More preferably, the projections do not cover the whole conduction surface.

Preferably, a flow diverter is located in the volume. This may take the form of a baffle plate or other passive flow control mechanism. Such a feature has the purpose of deflecting hot rising plumes of liquid away from components directly above that might otherwise over-heat.

Optionally, a plurality of electrical conductors are located in the volume, the plurality of electrical conductors being arranged to detect the level of the first cooling liquid. These electrical conductors preferably take the form of a pair of rods at the top of the module extending down into the volume. These can act as a capacitor, whose value changes as the liquid level alters (by application of the dielectric effect). By attaching a suitable electronic circuit, the liquid level for the first cooling liquid can be deduced. This allows the operator to know when the level is below normal for the current liquid temperature and indicates the likelihood of a leak. The same device could be used to determine liquid level during initial filling (or topping up) of the module.

Additionally or alternatively, a transparent window in the housing is used to observe the level directly. A further optional improvement would be to build the sensor and associated circuit into a circuit board on which the electronic component is mounted or adjacent to the electronic component.

In some embodiments where the conduction surface defines the channel, the shape of the channel is arranged in conformity with the shape of the electronic component. This allows further improvements in efficiency of heat transfer between the first cooling liquid and second cooling liquid.

In the preferred embodiment, the heat transfer device is formed in one piece. A one piece assembly for the heat transfer device may not require maintenance and could be constructed from a cold plate part into which channels were pre-formed and a sealing plate welded or otherwise adhered onto the cold plate part. This eliminates screws and gaskets and reduces the likelihood of liquid leakage.

In some embodiments, the heat transfer device further comprises a base part coupled to the conduction surface and defining the channel for receiving the second cooling liquid.

In one embodiment, the housing and conduction surface defines an inner chamber, and the heat transfer device further comprises an outer chamber, defining the channel.

The use of an outer chamber that defines the channel for receiving a second cooling liquid and which is arranged to cooperate with the inner housing to provide the conduction surface advantageously provides a compact module. Such an arrangement may additionally allow the width of the channel to be defined or adjusted to meet the heat transfer requirements. Optionally, the outer chamber is made from a synthetic plastic material.

Advantageously, the sealable module further comprises an insulation layer covering at least part of the housing. Preferably, the insulation layer is within the volume. Additionally or alternatively, the sealable module may comprise an insulation layer covering at least part of the housing, exterior to the volume. The exterior insulation may comprise flexible foam. This has the further advantage of being able to support the connectors for liquid input, output or both, whilst allowing an element of flexing of the pipes. This would make insertion into an associated rack easier by allowing more tolerance in the sliding parts.

Preferably, more than one electronic component may be located in the volume. In the preferred embodiment, the sealable module comprises a plurality of electronic components, at least one of which generates heat when in use, and further comprising a circuit board holding the plurality of electronic components.

By immersing the circuit board in a carefully selected liquid, it is isolated from damage by airborne pollutants or water that might otherwise condense out of the atmosphere, or leak elsewhere. Pollutants present in air or dissolved in water can readily attack the fine wiring on circuit boards, for example. Also, other heat generating components such as power supplies, DC-DC converters and disk drives can be encapsulated and cooled. Where the at least one electronic component includes a disk drive, the disk drive is preferably a solid state device. Devices with moving parts are undesirable for immersion in a liquid.

The first cooling liquid preferably occupies a portion of the volume of the sealable module, such that there is volume available for expansion of the liquid upon heating without significantly increasing the pressure in the volume.

Preferably, the sealable module further comprises a protective membrane positioned between the circuit board and the housing, the protective membrane being arranged to prevent liquid flow between the housing and the circuit board. This increases the thermal resistance through this undesirable path and reduces the volume of the coolant required to fill the volume, whilst allowing for the presence of small components on the rear of a circuit board. In the preferred embodiment, the protective membrane is deformable.

Advantageously, at least a part of the circuit board is integrally formed with the housing. The electronic circuit board could be integrated with part of the module housing, for example just using side walls. The interconnections could then pass directly through the circuit board to appear on the outer face of the housing, eliminating the need for cables to be sealed at the point of exit with the module. Optionally, the circuit board and walls are constructed as a single item thus reducing further the sealing issue, for example using a fibreglass moulding.

In the preferred embodiment, the sealable module further comprises: a filling inlet to the module, located in the housing and through which a liquid can be received into the volume; and a seal to the filling inlet. This allows quick filling or re-filling of the sealable module volume with cooling liquid in field.

Preferably, the sealable module comprises a pressure relief valve, located in the housing and arranged to allow liquid flow out from the volume when the pressure within the volume exceeds a predefined limit.

Optionally, the channel has an area of contact with the conduction surface defining a channel width, and wherein the minimum channel width is significant in comparison with the dimensions of the conduction surface.

Additionally or alternatively, the channel interfaces with the at least a portion of the conduction surface along a path having at least one change in direction. Preferably, the path has a straight portion, and wherein the minimum channel width is at least 10% of the length of the straight portion of the path. In other embodiments, the minimum channel width may be at least: 10%; 20%; 30%; 40%; or 50% of the length of the straight portion of the path. Additionally or alternatively, the path comprises a main path and a branch path, the branch path being connected to the main path at at least one point.

There may also be provided a cooled electronic system, comprising: the sealable module as described herein; an electronic component located in the volume; a first cooling liquid located in the volume; a heat sink; a pumping arrangement, arranged to allow a second cooling liquid to flow through at least a portion of the channel of the sealable module to the heat sink at a predetermined flow rate; a temperature sensor, arranged to determine a temperature of the electronic component; and a controller arranged to control at least one of: the pumping arrangement; and the portion of the channel through which the second cooling liquid flows, such that the temperature of the electronic component is controlled so as not to exceed a predetermined maximum operating temperature.

Beneficially, the conduction surface has at least one projection into the first volume for conducting heat between the volume and the channel. Where the sealable module includes the electronic component, the conduction surface preferably has at least one projection into the first volume for conducting heat between the volume and the channel, the at least one projection being arranged in conformity with the shape of the electronic component. In some embodiments, the sealable module further comprises a component heat sink coupled to the electronic component, having at least one projection arranged to cooperate with the at least one projection of the conduction surface. Advantageously, the at least one projection of the conduction surface comprises a fin arrangement. Alternatively or additionally, the at least one projection of the conduction surface comprises a pin arrangement. In the preferred embodiment, the at least one projection comprises a pin-fin arrangement.

A fourth aspect may be found in a method of cooling an electronic device, comprising: providing a module comprising a housing and a first heat transfer device having a conduction surface, the housing and the conduction surface together defining a volume, the volume being filled with a first cooling liquid and having the electronic device located therein; operating the electronic device within the volume; transferring heat generated by the electronic device from the first cooling liquid to a second cooling liquid through at least a portion of the conduction surface; transferring heat from the second cooling liquid to a heat sink using a second heat transfer device; and setting one or both of: the flow rate of the second cooling liquid from the conduction surface to the heat sink; and the portion of the conduction surface through which heat is transferred to the second cooling liquid, such that the temperature of the electronic device is controlled so as not to exceed a predetermined maximum operating temperature.

By setting the flow rate, area of heat transfer or both, the thermal resistance can advantageously be increased or reduced as needed to provide the desired temperature difference. This allows the electronic component to be maintained at a temperature no greater than its maximum operating temperature, even if the temperature difference decreases, for example, if the final heat sink temperature increases (such as when an atmospheric final heat sink is used). Optionally, the conduction surface is made from a synthetic plastic material.

Optionally, the method further comprises: determining a temperature of the electronic component. The step of setting is carried out on the basis of the determined temperature. This is a form of dynamic adjustment based on measured temperature.

Additionally or alternatively, the step of setting comprises at least one of: the flow rate of the second cooling liquid from the conduction surface to the heat sink; and the portion of the conduction surface through which heat is transferred to the second cooling liquid being set to a predetermined level on the basis of a predicted predetermined maximum operating temperature for the electronic device. In such embodiments, the flow rate, portion of the conduction surface or both are pre-set based on a predicted heat output or heat output range from the electronic device.

In a fifth aspect, there is provided a cooled electronic system, comprising: a sealed container comprising: a housing; an electronic device; and a first cooling liquid; a first heat transfer device defining a first channel for receiving a second cooling liquid, the first heat transfer device being configured to transfer heat between the first cooling liquid and the first channel through at least a portion of a conduction surface; and a piping arrangement, configured to transfer the second cooling liquid to and from the first heat transfer device. The system is configured to set one or both of: the flow rate of the second cooling liquid through the first channel; and the portion of the conduction surface through which heat is transferred to the second cooling liquid, such that the temperature of the electronic device is controlled so as not to exceed a predetermined maximum operating temperature. Advantageously, the second cooling liquid flows from the conduction surface to a heat sink.

A sixth aspect may be provided by a method of cooling an electronic device, comprising: operating the electronic device within a container, the container also comprising a first cooling liquid, such that heat generated by the electronic device is transferred to the first cooling liquid, the container being sealed to prevent leakage of the first cooling liquid; transferring heat between the first cooling liquid and a second cooling liquid in a first heat transfer device; piping the second cooling liquid from the first heat transfer device to a second heat transfer device; transferring heat between the second cooling liquid and a third cooling liquid in the second heat transfer device; and piping the third cooling liquid to a heat sink.

Thus, three stages of liquid cooling are provided, which allows the flow rate and pressure of the second cooling liquid and third cooling liquid to be independently controlled. The pressure of second cooling liquid can therefore be reduced to further mitigate the risk of leakage of this liquid. Since these liquids are in close proximity to the electronic components, leakage is undesirable. Also, the flow rates can advantageously be controlled based upon the level of heat generated to improve the efficiency of heat transfer at each stage.

Preferably, the step of transferring heat between the first cooling liquid and the second cooling liquid is carried out by conduction.

In the preferred embodiment, the method further comprises: controlling the flow rate of the second cooling liquid, such that the temperature of the electronic device does not exceed a predetermined maximum operating temperature. Additionally or alternatively, the method may also comprise: controlling the flow rate of the third cooling liquid, such that the temperature of the electronic device does not exceed a predetermined maximum operating temperature. This allows the flow rate of second cooling liquid to be matched to the level or rate of heat generation.

Where the first heat transfer device comprises a conduction surface, the method optionally further comprises setting the portion of the conduction surface through which heat is transferred to the second cooling liquid, such that the temperature of the electronic device is controlled so as not to exceed a predetermined maximum operating temperature. This can be achieved, for example, using multiple channels in the conduction surface for carrying the second cooling liquid and appropriate control valves or baffle plates to determine the channel or channels along which the second cooling liquid should flow, or to balance the flow rate of cooling liquid appropriately between different channels in order to maintain the temperature of the electronic device below a threshold. The channels thereby provide similar or different liquid flow rates over different areas and thus different heat transfer rates from different parts of the conduction surface.

In some embodiments, the method may further comprise controlling at least one of: the flow rate of the second cooling liquid; and the flow rate of the third cooling liquid, such that the temperature of the electronic device does not exceed a predetermined maximum operating temperature and such that, during a first time period, the heat transfer rate between the second cooling liquid and the third cooling liquid or between the third cooling liquid and the heat sink does not go above a predetermined maximum rate, and such that during a second, later time period, the heat transfer rate between the second cooling liquid and the third cooling liquid or between the third cooling liquid and the heat sink may go above the predetermined maximum rate.

Optionally, the step of controlling is carried out such that the temperature of the electronic device does not exceed a predetermined maximum operating temperature and such that, during a first time period, the temperature of at least one of: the second cooling liquid; and the third cooling liquid does not go below a predetermined minimum average temperature, and such that during a second, later time period, the temperature of the second cooling liquid and the third cooling liquid may go below the predetermined minimum average temperature.

In a further aspect, there is provided a method of cooling an electronic device, comprising: operating the electronic device within a container, the container also comprising a first cooling liquid, such that heat generated by the electronic device is transferred to the first cooling liquid, the container being sealed to prevent leakage of the first cooling liquid; transferring heat between the first cooling liquid and a second cooling liquid in a first heat transfer device; transferring heat between the second cooling liquid and a heat sink; and controlling the heat transfer rate between the second cooling liquid and the heat sink, such that the temperature of the electronic device does not exceed a predetermined maximum operating temperature and such that, during a first time period, the heat transfer rate does not go above a predetermined maximum rate, and such that during a second, later time period, the heat transfer rate may go above the predetermined maximum rate.

An advantageous feature of the system used in the method is the high thermal capacity of the cooling arrangement. This has a number of benefits and opportunities. Failure of a part of the system will not lead to immediate component damage. The temperature will rise but not quickly, giving maintenance staff more time to isolate the faulty part and minimise further failures. Similarly, the system is able to cope with environments with high diurnal ambient temperature variations. Heat built up during the day can be tolerated by the system without exceeding maximum component operating temperatures. The heat can be safely dissipated at night to the cold. The system flow management algorithm may be arranged to take account of such high diurnal ambient variations.

Advantageously, a method of cooling an electronic system is provided, comprising: carrying out the method steps of cooling an electronic device in accordance with this sixth aspect; operating a second electronic device within a second container, the second container also comprising a fourth cooling liquid, such that heat generated by the electronic device is transferred to the fourth cooling liquid, the second container being sealed to prevent leakage of the fourth cooling liquid; and transferring heat between the fourth cooling liquid and a fifth cooling liquid in a third heat transfer device. Optionally, the method further comprises controlling the flow rate of the fifth cooling liquid.

A unit with two containers may be heavy and difficult to install in a rack, as they could exceed health and safety limits for a one-person lift. In one embodiment, first and second containers are used and these containers are provided back-to-back. In other words, the connectors of the first container are positioned adjacent to the connectors of the second container. Back-to-back containers with centralised cabling and liquid pipes in a rack would allow units with one module and single person lift.

Preferably, the second cooling liquid and the fifth cooling liquid are combined. This allows efficient cooling of multiple electronic devices using separate first cooling stages, but a common second stage of cooling. More preferably, the method further comprises piping the second cooling liquid from the first heat transfer device and the fifth cooling liquid from the third heat transfer device to a plenum chamber. Most preferably, the second cooling liquid and the fifth cooling liquid are combined before arrival at the plenum chamber. Optionally, the method also comprises: piping the second cooling liquid from a plenum chamber to the first container and piping the fifth cooling liquid from the plenum chamber to the second container.

Optionally, the method further comprises controlling the flow rate of the combined second cooling liquid and fifth cooling liquid, such that the temperature of the first electronic device does not exceed a first predetermined maximum operating temperature and such that the temperature of the second electronic device does not exceed a second predetermined maximum operating temperature.

In this embodiment, individual flow control, per module, is not necessary. The overall flow rate of the combined liquid can be controlled with satisfactory results, when combined with pre-set flow balancing of liquid to each cooling unit, for example, by means of baffles in the supply side plenum chamber.

In an alternative embodiment, the method further comprises: piping the fifth cooling liquid from the third heat transfer device to a fourth heat transfer device; and transferring heat between the fifth cooling liquid and the third cooling liquid in the fourth heat transfer device.

In an seventh aspect, there may be found in a cooled electronic system, comprising: a sealed container comprising: a housing; an electronic device; and a first cooling liquid; a first heat transfer device defining a first channel for receiving a second cooling liquid, the first heat transfer device being configured to transfer heat between the first cooling liquid and the first channel; and a second heat transfer device comprising a second channel for receiving the second cooling liquid from the first channel, and a third channel for receiving a third cooling liquid for coupling to a heat sink, the second heat transfer device being configured to transfer heat between the second channel and the third channel.

Preferably, the first heat transfer device comprises a conduction surface, the housing and the conduction surface together defining a volume in which the electronic component and the first cooling liquid are located. More preferably, the conduction surface separates the volume and the first channel to allow conduction of heat between the volume and the channel through the conduction surface.

Beneficially, at least a portion of the conduction surface or housing is shaped in conformity with the shape of the electronic device.

Advantageously, the conduction surface has at least one projection for receiving heat from the first cooling liquid. In the preferred embodiment, the at least one projection is arranged in conformity with the shape of the electronic device. Optionally, the cooled electronic system further comprises a component heat sink coupled to the electronic device and comprising at least one projection arranged to cooperate with the at least one projection of the conduction surface.

Beneficially, the at least one projection of the conduction surface comprises a fin arrangement. Alternatively or additionally, the at least one projection of the conduction surface comprises a pin arrangement. In the preferred embodiment, the at least one projection comprises a pin-fin arrangement.

In one embodiment, the heat transfer device further comprises a base part coupled to the conduction surface and defining the channel for receiving the second cooling liquid.

Advantageously, the conduction surface is made from a synthetic plastic material. Additionally or alternatively, the housing may be made from a synthetic plastic material. In embodiments, the base part of the heat transfer device may be made from a synthetic plastic material.

Optionally, the module further comprises: a filling inlet to the container, through which the first cooling liquid can be received; and a seal to the filling inlet. Additionally or alternatively, the module further comprises a pressure relief valve, arranged to allow outflow of the first cooling liquid from the container when the pressure within the container exceeds a predefined limit.

Where the electronic device has an elongate axis, the conduction surface preferably has an elongate axis arranged in conformity with the elongate axis of the electronic device to allow conduction of heat between the volume and the channel through the conduction surface.

Optionally, the cooled electronic system further comprises a flow control device, arranged to control the flow rate of the second cooling liquid, such that the temperature of the electronic device does not exceed a predetermined maximum operating temperature.

Additionally or alternatively, the cooled electronic system may further comprise a flow control device, arranged to control the flow rate of the third cooling liquid, such that the temperature of the electronic device does not exceed a predetermined maximum operating temperature.

In some embodiments, the sealed container is a first sealed container, and the cooled electronic system further comprises: a second sealed container comprising: a second housing; a second electronic device; a fourth cooling liquid for receiving heat from the second electronic device; and a third heat transfer device comprising a fourth channel for receiving a fifth cooling liquid, the third heat transfer device being configured to transfer heat from the fourth cooling liquid to the fourth channel.

Preferably, the first channel and the fourth channel are coupled to combine the second cooling liquid and the fifth cooling liquid. Optionally, the cooled electronic system further comprises a plenum chamber, arranged to collect the combined second cooling liquid and fifth cooling liquid.

Advantageously, the cooled electronic system further comprises a flow control device, arranged to control the flow rate of the combined second cooling liquid and fifth cooling liquid, such that the temperatures of the first electronic device and the second electronic device do not exceed first and second predetermined maximum operating temperatures respectively.

Preferably, the flow control device comprises a flow diverting arrangement, the flow diverting arrangement being configured to set the flow rate of the second cooling liquid such that the temperature of the first electronic device does not exceed a first predetermined maximum operating temperature, and to set the flow rate of the fifth cooling liquid such that the temperature of the second electronic device does not exceed a second predetermined maximum operating temperature.

Alternatively, the cooled electronic system further comprises a fourth heat transfer device comprising a fifth channel for receiving the fifth cooling liquid from the fourth channel, and a sixth channel for receiving a sixth cooling liquid for coupling to a heat sink, the second heat transfer device being configured to transfer heat between the fifth channel and the sixth channel.

In an eighth aspect, there may be found in a method of filling the interior a container for an electronic device with a cooling liquid, the method comprising: adapting the container to receive the cooling liquid by at least one of: heating the container to a filling temperature; and reducing the pressure in the interior of the container; filling the container with the cooling liquid; and sealing the container to prevent leakage of the cooling liquid.

By adapting the container and liquid to a filling temperature or pressure and filling the container with the liquid at this temperature or pressure, the volume of the interior space of the container that is filled with liquid under operating conditions is increased, without significantly increasing the pressure within the container. Excessive pressure may result in damage to the container or the electronic device.

Optionally, the method further comprises: heating the cooling liquid to the filling temperature; and cooling the sealed container and cooling liquid to an operating temperature.

In some embodiments, the step of filling the container is carried out before the step of adapting the container. Optionally, the step of adapting the container comprises operating the electronic device.

In a ninth aspect, there is provided a method of filling the interior a container for an electronic device with a cooling liquid, the method comprising: heating the cooling liquid to a filling temperature; filling the container with the heating cooling liquid; sealing the container to prevent leakage of the cooling liquid; and cooling the sealed container and cooling liquid to an operating temperature. This is an alternative to the eight aspect and the eighth and ninth aspects can also optionally be combined.

In either or both of the eighth and ninth aspects, there are a number of preferable or optional features. Advantageously, the filling temperature is selected such that gases dissolved in the cooling liquid are removed from the cooling liquid. Hence, air, moisture and other dissolved gases are removed from the interior of the container. The need for a desiccant in the container is reduced or avoided.

Preferably, the filling temperature is selected on the basis of the maximum operating temperature of the electronic device. Beneficially, the filling temperature is selected to be equal to or greater than the maximum operating temperature of the electronic device.

In the preferred embodiment, the step of filling the container is carried out such that all air in the container is displaced.

There is also provided a cooling apparatus configured to use a liquid coolant for carrying heat removed from an electronic device. The cooling apparatus includes a heat exchanger arrangement, configured to receive the liquid coolant, to transfer heat from a first portion of the liquid coolant to a first heat sink and to transfer heat from a second portion of the liquid coolant to a second heat sink. The first and second heat sinks may be isolated from one another. Moreover, there is provided a method of operating a cooling system that uses a liquid coolant for carrying heat removed from an electronic device, in which a first portion of the liquid coolant may be received at a heat exchanger arrangement, so as to transfer heat from the first portion of the liquid coolant to a first heat sink. A second, separate portion of the liquid coolant may be received at the heat exchanger arrangement, so as to transfer heat from the second portion of the liquid coolant to a second heat sink. The first and second heat sinks may be isolated from one another.

A method of manufacturing a cooling system that uses a liquid coolant for carrying heat removed from an electronic device may include providing a first heat exchanger for receiving a first portion of the liquid coolant, so as to transfer heat from the first portion of the liquid coolant to a first heat sink; and providing a second heat exchanger in parallel with the first heat exchanger for receiving a second, separate portion of the liquid coolant, so as to transfer heat from the second portion of the liquid coolant to a second heat sink. The first and second heat sinks may be isolated from one another.

In a further aspects, there may be provided a cooling apparatus which includes an interfacing component configured to receive an electronic device and defining a thermal interface through which heat generated by the electronic device can be transferred away from it; and a heat exchanger arrangement, coupled to the thermal interface and configured to transfer heat generated by the electronic device via the thermal interface to a first heat sink and a second heat sink. The first and second heat sinks may be isolated from one another.

Thus, redundancy may be provided at the level of a module, which may be a single container or mounting used for cooling one or more components. Each component may be a single electronic component or it may be a device comprising a plurality of electronic components (such as a circuit board) or a plurality of such devices.

Advantageously, in the event that a part of the heat exchanger arrangement is unable to transfer heat to the first heat sink, the heat exchanger arrangement may be configured to transfer at least some (or all) of the heat that would have been transferred to the first heat sink to the second heat sink. Thus, if the part of the heat exchanger arrangement transferring heat to one heat sink fails, the heat exchanger arrangement may be configured to transfer a greater proportion of heat to the other heat sink. This may act to provide redundancy.

In some embodiments, the heat exchanger arrangement is configured to transfer an approximately equal proportion of the heat received from the electronic device to the first heat sink as the second heat sink. In other words, the heat exchanger arrangement may divide the heat output between the two heat sinks roughly equally, such that the two share the load. However, the ratio of heat transfer may be controlled or may be set differently (for example, 45%:65%, 40%:60%, 35%:75%, 30%:70%, 25%:75%, 20%:80%, 10%:90%, 5%:95%). The capacity of the first heat sink and the second heat sink may be the same in many embodiments.

In some embodiments, the interfacing component includes a housing that defines at least part of a volume in which a coolant and at least part of the electronic device can be located, such that the coolant can provide the thermal interface by convection. The heat exchanger arrangement may then include a first heat exchanger, having a part located in a first part of the volume and configured to transfer heat from a first portion of the coolant to the first heat sink; and a second heat exchanger, having a part located in a second part of the volume and arranged in parallel with the first heat exchanger, the second heat exchanger being configured to transfer heat from a second portion of the coolant to the second heat sink.

Thus, a sealable module that is similar to the module described above may be provided, but with a second, parallel heat exchanger. This parallel heat exchanger provides redundancy, allowing cooling to continue even if the first heat exchanger fails for any reason. Moreover, it increases the efficiency of cooling.

In some configurations it may be preferred that the first heat exchanger include a first conduction surface that cooperates with the housing so as to define at least part of the volume. In other words, the sealable module may be formed as a container, a part of the container walls being defined by the housing and another part of the container walls being defined by the first conduction surface.

In embodiments, the first heat exchanger further defines a first channel for receiving a first outer liquid coolant. Then, the first conduction surface may separate the volume and the first channel to allow conduction of heat between the volume and the first channel through the first conduction surface. Thus, the first heat sink is provided by the first outer liquid coolant that carries heat from the liquid coolant within the volume away from the sealable module via conduction through the first conduction surface.

Advantageously, the cooling apparatus also may include the electronic device. Then, at least a portion of the first conduction surface or housing may be shaped in conformity with the shape of the electronic device. This conformity of shape may further improve efficiency.

The second heat exchanger may be formed in a similar way to the first heat exchanger. Thus, the second heat exchanger may include a second conduction surface that cooperates with the housing (and optionally, the first conduction surface) so as to define at least part of the volume. Then, the second heat exchanger may further define a second channel for receiving a second outer liquid coolant. In this case, the second conduction surface may separate the volume and a second channel to allow conduction of heat between the volume and second channel through the second conduction surface. In this way, the first and second outer liquid coolants may be isolated from one another. This may achieve the isolation of the first and second heat sinks. Advantageously, this may also improve the flexibility, efficiency and robustness of the first and second heat exchangers.

Where the cooling apparatus includes the electronic device, at least a portion of the second conduction surface or housing is optionally shaped in conformity with a shape of the electronic device. This may depend on the configuration of the component or components, but also on the configuration of the first and second heat exchangers and particularly the first and second conduction surfaces.

The electronic device may take a large number of different forms. In a preferred embodiment, the electronic device includes a circuit board. This may then define a substantially planar form for the electronic device.

Whether or not the electronic device is planar, it may have an axis of elongation. This especially applies when the electronic device includes a circuit board, but it can also be the case where the electronic device is a discrete package or a combination of discrete packages not mounted on a circuit board. While the electronic device has an axis of elongation, the first conduction surface may have a respective axis of elongation that is substantially parallel to the axis of elongation of the at least one electronic component. Additionally or alternatively, the second conduction surface may have an axis of elongation that is substantially parallel to the axis of elongation of the at least one electronic component. In a preferred embodiment, both the first and second conduction surfaces have parallel axes of elongation.

The first conduction surface may have a substantially planar form. Additionally or alternatively, the second conduction surface may have a substantially planar form. Where the electronic device and the first conduction surface both have a substantially planar form, the planes of the first conduction surface may be substantially parallel to the plane of the electronic device. Additionally or alternatively, the electronic device and the second conduction surface may both have a substantially planar form and the plane of the second conduction surface may be substantially parallel to the plane of the electronic device.

In some embodiments, the housing and the first and second conduction surfaces define the volume. Thus, a container with integrated heat exchangers can be provided. Optionally, the housing, the first and second conduction surfaces and the electronic device define the volume. Then, the electronic device itself forms an integral part of the module outer container. In particular, the volume may further includes a wicking material such that a vapour chamber is formed.

The coolant may preferably include a fluid. In many embodiments, the coolant includes a liquid (defined at standard or operating temperature and pressure). In embodiments, the cooling apparatus further includes the coolant.

Where the heat exchanger arrangement or the interfacing component includes a conduction surface, the heat exchanger arrangement may further include a first piping system, arranged to carry a first coolant, to receive heat directly from the conduction surface and to transfer heat through the conduction surface to the first coolant; and a second piping system, arranged in parallel with the first piping system to carry a second coolant, to receive heat directly from the conduction surface and to transfer heat through the conduction surface to the second coolant. The first and second coolants may be isolated from one another. In these embodiments, the heat exchanger arrangement may be provided by a single cold plate with multiple coolant channels, each of which is isolated from the others. This provides redundancy by use of a single heat exchanger (the cold plate), whilst still providing two separate heat sinks.

In embodiments, the first piping system and second piping system are arranged in parallel in a three-dimensional crossing arrangement, such as in a helical arrangement. In other words, the two channels cross (or spiral) to receive roughly equal proportions of the heat and avoid placing too great a load on one heat sink under normal operation. In some embodiments, the interfacing component preferably includes the conduction surface that is configured for attachment to the electronic device, such that the thermal interface is provided by conduction. Thus, the cold plate may be affixed directly to a surface of the electronic device (such as a circuit board). Some thermally conductive material may interpose between the electronic device and the conduction surface, although the conduction surface is still physically attached to the electronic device through this material.

In some embodiments, the interfacing component includes a housing that defines at least part of a volume in which a third coolant and at least part of the electronic device can be located. This may mean that the third coolant can provide the thermal interface by convection to the conduction surface that forms part of the heat exchanger arrangement. Then, the third coolant may be isolated from the first and second coolants.

In other aspects, there may be provided a cooling system including the cooling apparatus as described herein, as well as a piping system, configured to carry a first outer coolant for acting as the first heat sink of the first heat exchanger arrangement and to carry a second outer coolant for acting as the second heat sink of the heat exchanger arrangement. Then, the first and second outer coolants may be isolated from one another. The piping system may then be configured to allow multiple modules to be connected with a series or parallel connection (or combination of the two) to share the first outer coolant, second outer coolant or both.

It may be advantageous for the cooling system to include a second heat exchanger arrangement, configured to receive a first outer coolant and a second outer coolant. Then, the second heat exchanger arrangement may be configured to transfer heat from the first and second outer coolants to a common output heat sink. The heat exchanging arrangement may include one or more than one heat exchanger. It will therefore be understood that the first and second heat sinks of the first and second heat exchangers are isolated from one another, but these two heat sinks may have their own heat sinks and these heat sinks need not be isolated from one another.

In further aspects, there may be provided a method of operating a cooling system that includes coupling an electronic device to an interfacing component that defines a thermal interface through which heat generated by the electronic device can be transferred away from it; operating the electronic device to generate heat that is transferred to the thermal interface; receiving heat generated by the electronic device at a heat exchanger arrangement via the thermal interface; and transferring heat received at the heat exchanger arrangement to a first heat sink and a second heat sink. The first and second heat sinks may be isolated from one another.

It will be understood that method features corresponding with the structural, apparatus features described above may optionally be provided in conjunction with the method. Some of these are now explicitly defined below.

In some configurations, such as in the event that a part of the heat exchanger arrangement is unable to transfer heat to the first heat sink, at least some of the heat that would have been transferred to the first heat sink may be transferred to the second heat sink. Optionally, the step of transferring heat may include transferring an approximately equal proportion of the heat received from the electronic device to the first heat sink as the second heat sink.

Optionally, an interfacing component may include a housing that defines at least part of a volume. Then, a coupling technique as disclosed herein may include locating at least part of the electronic component in the volume together with a coolant, such as a liquid coolant, such that the coolant can provide the thermal interface by convection. Here, a step of receiving heat may include receiving a first portion of the coolant at a first heat exchanger located in a first part of the volume, so as to transfer heat from the first portion of the coolant to the first heat sink; and receiving a second, separate portion of the coolant at a second heat exchanger arranged in parallel with the first heat exchanger and located in a second part of the volume, so as to transfer heat from the second portion of the coolant to the second heat sink.

In order to receive the first portion of the coolant at the first heat exchanger, heat received from the first portion of the coolant may be transferred to a first outer coolant. Additionally or alternatively, in order to receive the second portion of the coolant at the second heat exchanger, heat received from the second portion of the coolant may be transferred to a second outer coolant. Where the first and second outer coolants are used, these may be isolated from one another. Advantageously, the first and second outer coolants also may be liquids.

Such a method may further include receiving the first and second outer coolants at a heat exchanging arrangement; and transferring heat from the first and second outer coolants to a common output heat sink using the heat exchanging arrangement.

In yet further aspects, there may be provided a method of manufacturing a cooling system, which includes coupling an electronic device to an interfacing component that defines a thermal interface through which heat generated by the electronic device can be transferred away from it; mounting a heat exchanger arrangement on the interfacing component in order to transfer heat from the electronic device to the heat exchanger arrangement via the thermal interface; and configuring the heat exchanger arrangement so as to transfer heat received from the electronic device to a first heat sink and a second heat sink. The first and second heat sinks are isolated from one another. Optionally, the method may further include filling the volume with the cooling liquid.

Again, it will be understood that this method may include optional method steps corresponding with any one or more of the apparatus features defined herein.

A coupling technique as disclosed herein may include housing an electronic device in a volume defined by a sealable module, such that a liquid coolant may be added to the volume for removing heat generated by the electronic device. Then, a heat exchanger arrangement may be mounted by mounting a first heat exchanger in a first part of the volume so that it can receive a first portion of the liquid coolant and transfer heat from the first portion of the liquid coolant to a first heat sink; and mounting a second heat exchanger in parallel with the first heat exchanger in a second part of the volume so that it can receive a second, separate portion of the liquid coolant and transfer heat from the second portion of the liquid coolant to a second heat sink. Optionally, the method may further include filling the volume with the cooling liquid.

BRIEF DESCRIPTION OF THE DRAWINGS

The invention may be put into practice in various ways, a number of which will now be described by way of example only and with reference to the accompanying drawings in which:

FIG. 13 is a schematic diagram of a cooling apparatus with additional redundancy;

FIG. 17 is a schematic diagram of a cooling apparatus with additional redundancy as an alternative to that shown in FIGS. 13, 14, 15 and 16.

SPECIFIC DESCRIPTION OF PREFERRED EMBODIMENTS

Figure 5:
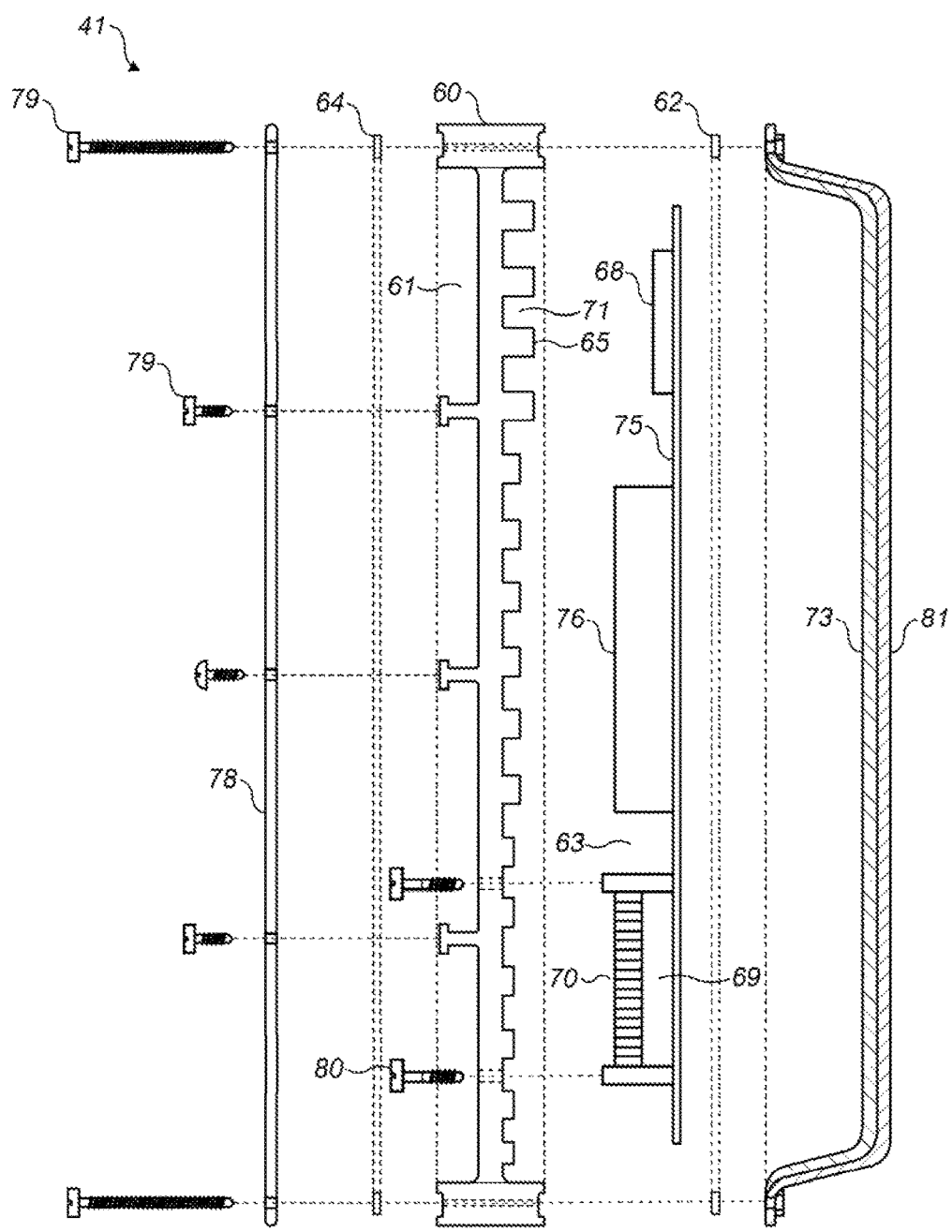
FIG. 5 is a cross-sectional exploded view of a sealable module comprising a heat generating electronic component according to an embodiment.

Referring first to FIG. 5, there is shown a cross-sectional exploded view of a sealable module 41 comprising a heat generating electronic component 69 according to an embodiment. The sealable module comprises: a housing 81; a finned conduction surface 71 forming part of a cold plate 60; a container volume, defined after assembly of the components by the housing 81 and conduction surface 71 and filled with a first cooling liquid (not shown); liquid flow channels 61 adjacent the conduction surface 71; small electronic component 68; large electronic component 69; and memory module 76.

The sealable module further comprises: an electronic circuit board 75; mounting pillars 63 for the electronic circuit board 75; a component heat sink 70 attached to the large electronic component 69; screws 80 to attach the mounting pillars 63 to the conduction surface 71; a cover plate 78 for the side of the cold plate opposite to the fins on the conduction surface; insulation 73 for the housing 81; first sealing gasket 62; second sealing gasket 64; screws 79 to hold the components of the cold plate assembly together; and pin-fin projections 65 on the conduction surface 71. The insulation 73 can also serve as a protective membrane between the housing 81 and the circuit board 75.

The cold plate 60 is fabricated with two faces, each with a separate function. Conduction surface 71 is a pin-finned plate, forming one face of the cold plate. A housing 81 is attached to the pin-finned plate 71, in such a way as to provide an internal space for an electronic circuit board 75, the pins of the cold plate and a first cooling liquid (not shown). A gasket 62 ensures that the assembled capsule is substantially sealed against liquid loss or ingress of air. The pin-finned plate is effectively the lid of the assembled capsule.

The electronic circuit board 75 carrying components to be cooled is attached to the cold plate 60 by mounting pillars 63, so as to suspend the board from the cold plate 60, allowing accurate alignment of the fins of the cold plate with components on the board, prior to attaching the housing 81. Alternatively, the board may be attached to housing 81 by mounting bosses extending from the housing 81 or equivalent means.

The fins 65 of the pin-finned conduction surface 71 normally face the component side of the circuit board 75. In some cases, components of significant size may be present on both sides of the board. The housing may then be contoured around the components on the side of the board opposite the pin-finned conduction surface 71, in order to improve flow of the cooling liquid and reduce the amount of cooling liquid needed.

In the embodiment shown in FIG. 5, the cold plate is fabricated in a single part, with two separately formed faces. Alternatively, the plate may be manufactured in two parts: a pin-finned plate whose opposite face is flat; and a plate with channels 61 for liquid flow, again with a flat opposite face; the two flat faces being joined on assembly. The cold plate assembly 60 has a surface opposite to the pin-finned conduction surface into which channels whose cross section is shown at 61 are manufactured.

The component side of the electronic circuit board 75 faces the fins 65 on the conduction surface 71. A small gap between the ends of the fins and the components is provided. The fins have an elongated cross-section and the height of the fins varies, so as to maintain a small gap between the variously sized components on the electronics circuit board and the tops of the fins. The faces of the electronic components 68 and 69 and the edge of the memory module 76 project by different amounts from the surface of the board. Small component 68 has a relatively low profile and large component 69 has a much deeper profile and the corresponding fins 65 have accordingly different heights. The height of the pin-fins and the gap between components on the circuit board 75 and the top of the pin-fins are arranged to be as small as possible, consistent with the requirement for efficient cooling. This arrangement reduces the total quantity of cooling liquid needed in the capsule and improves packing density of cooling units.

When the system is in operation, heat generated by the components 68, 69 and memory module 76 on the circuit board is transferred to the cooling liquid (not shown), initially by local conduction and then, as the heated liquid expands and becomes buoyant, by convection. The convecting liquid quickly comes into contact with the fins 65 and other surfaces of the conduction surface 71.

Heat from the fins 65 of the conduction surface 71 is conducted to the circulating second liquid that flows via channels 61, so as to cool the conduction surface 71 and thus cooling liquid.

Components on circuit board 75 that generate the largest amount of heat are typically microprocessors. In this case, cooling efficiency for such components may be improved by additionally fitting a finned component heat sink 70, in direct physical and thermal contact with the component, whose fins may interleave with the array of fins on the cold plate. The fins of the component heat sink may be at least partially in physical contact with the pin-fins of the cold plate. Gaps remain through which the first cooling liquid can flow.

An additional insulating layer 73 is provided, preferably on the inside of the housing 81 of the sealable module 41. Additional insulation may also be added to the exterior of the cold plate cover 78 and to the edges of the cold plate 60. The insulation reduces local heat loss into the atmosphere, which can be significant in large installations with many electronic circuit boards, causing room temperature to rise to undesirable levels.

Electronic circuit board 75 may carry major components only on one side or the other side may carry only small components that generate low amounts of heat in operation. The operation of the sealable module 41 may then be improved by excluding liquid flow adjacent to the non-component side of the circuit board 75. The insulation 73 may then act as a flexible protective membrane between the circuit board 75 and the housing 81, that can accommodate to the shape of the small components that may be mounted on this side of the board. Alternatively, a separate protective membrane (not shown) could be provided between the housing 81 and the electronic circuit board 75. Convective flow of the cooling liquid is then concentrated in the space between the main component side of the circuit board 75 and the conduction surface 71.

Application of the invention is not limited to computing systems. However, since computing systems generate significant heat, they can benefit from improved cooling. In such systems, one or more microprocessors and several other digital and analogue devices such as memory chips (RAM, ROM, PROM, EEPROM and similar devices), specialised integrated circuits (ASICs) and a range of associated active and passive components are typically mounted on a circuit board, whose function is to act as a major part of a computing system. Although electronic components can be mounted on both sides of the circuit board, it is more usual to mount at least the bulky components on one side only. Other devices are connected to the circuit board by cables, optical means or wireless transmission, the whole forming a computer, computer system or server.

Heat is generated by the various components but, typically, the microprocessor is the highest heat-generating component. An optimally designed cooling system removes sufficient heat from each component to keep it within its designed operating temperature range but no more than that. Devices that generate less heat need less cooling than those that generate larger amounts. Cooling below a level necessary for satisfactory operation will normally consume unnecessary additional energy and is therefore less than optimally efficient.

Moreover, packing density of components on computer boards is determined partly by the traditional size of computer housings and the assumption that air-cooling may be employed. In large systems, especially server centres, increasing the packing density of components to reduce overall space occupied is desirable. At the same time, heat generated will be concentrated in a smaller space and needs more effective means of removal. Improving heat removal may enable component packing density to be increased and, more particularly, allow processing power per unit volume to increase.

Figure 6:
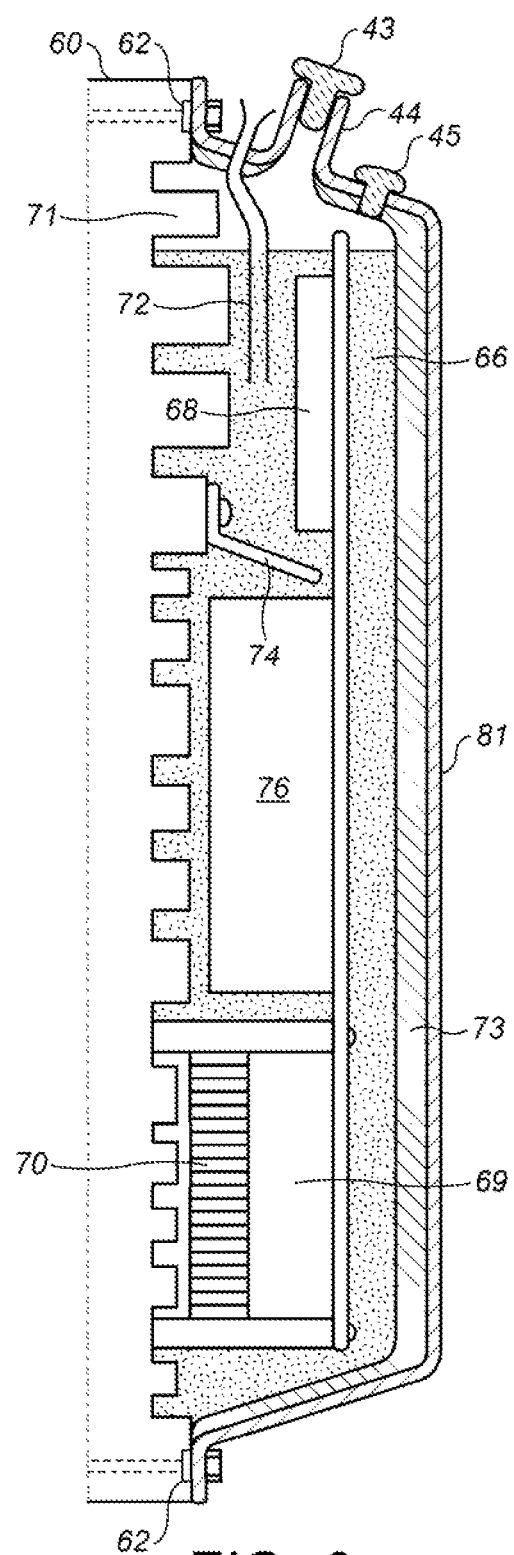
FIG. 6 is a cross-sectional view of the upper part of the sealable module of FIG. 5.

Referring now to FIG. 6, there is shown a cross-sectional view of the upper part of the sealable module 41 of FIG. 5. Where the same features are shown, identical reference numerals are used. The depth of the module is exaggerated to clarify details of some features that would otherwise be difficult to illustrate. FIG. 6 additionally shows: first cooling liquid 66; a filling inlet 44; seal 43; a pressure relief device 45; fastener 82 for receiving assembly screw 79; sealing gasket 62; baffle plate 74; and capacitive rods 72. The filling inlet 44 is intended for receiving the first cooling liquid 66 and has a seal 43 to prevent liquid loss once the sealable module 41 is filled. A pressure relief device 45 allows escape of liquid under extreme conditions, outside a normal range of: temperature; pressure; or both.

Normally, larger components that generate the highest amount of heat are located towards the lower part of the module 41. In some circumstances, the heated liquid 66 may rise in a narrow convection plume that could overheat components located higher in the module. Baffle plate 74 may then be fitted to deflect the hot plume of liquid away from the components in the upper part of the module and aid mixing with cooler liquid for re-circulation within the module. Similarly, where two or more processors that generate large amounts of heat are fitted to circuit board 75, it is possible that one processor is above the other and receives heated liquid from the lower mounted processor. A baffle plate 74 or a similar or equivalent means of passively deflecting hot liquid may then be fitted in the lower part of the module.

Typically, cooling liquid 66 is a volatile substance. Small leaks from the module may be difficult to detect, since the liquid may evaporate before being observed. Capacitive rods 72 may then be fitted in the upper part of the module 41, normally immersed in liquid 66 and connected to an external detector (not shown) that measures the capacitance. In the event that the liquid leaks from the module, the level of liquid 66 will drop and the capacitance will alter. If the capacitance alters appreciably, an alarm can thus be generated, indicating excessive loss of liquid from the module. The capacitive rods 72, the connections thereto and a detection circuit may alternatively be built in to a customised electronic circuit board, thus simplifying assembly of the complete capsule and removing the possibility of leakage of liquid from the entry point of the capacitive rods 72 into the housing 81.

An alternative means of monitoring the liquid level is a small transparent window (not shown) that may also be fitted to the upper part of housing 81. This window allows direct observation of the level of liquid 66 within the module.

Figure 7:
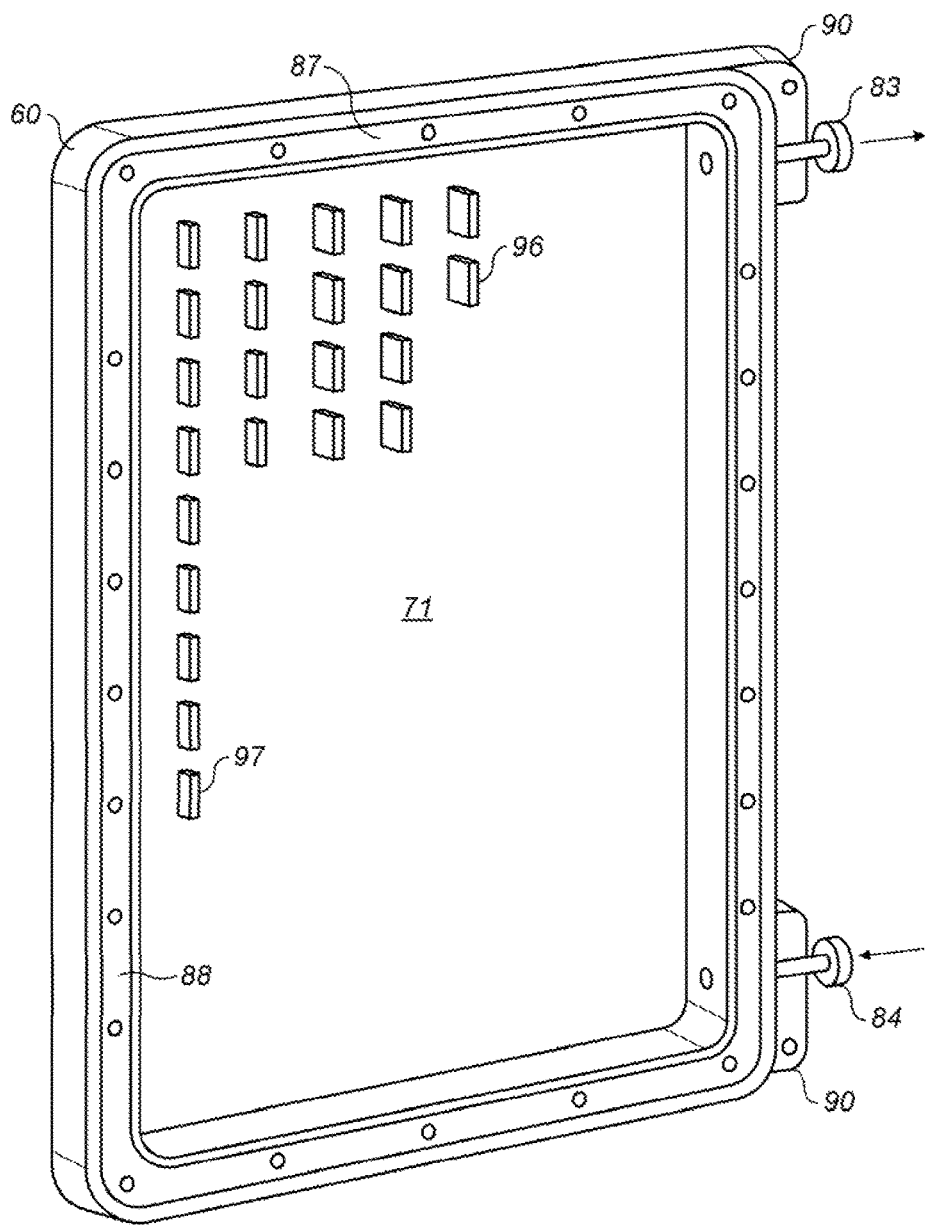
FIG. 7 shows the sealable module face of an embodiment of a cold plate, for use with the sealable module of FIG. 5.
Figure 7A:
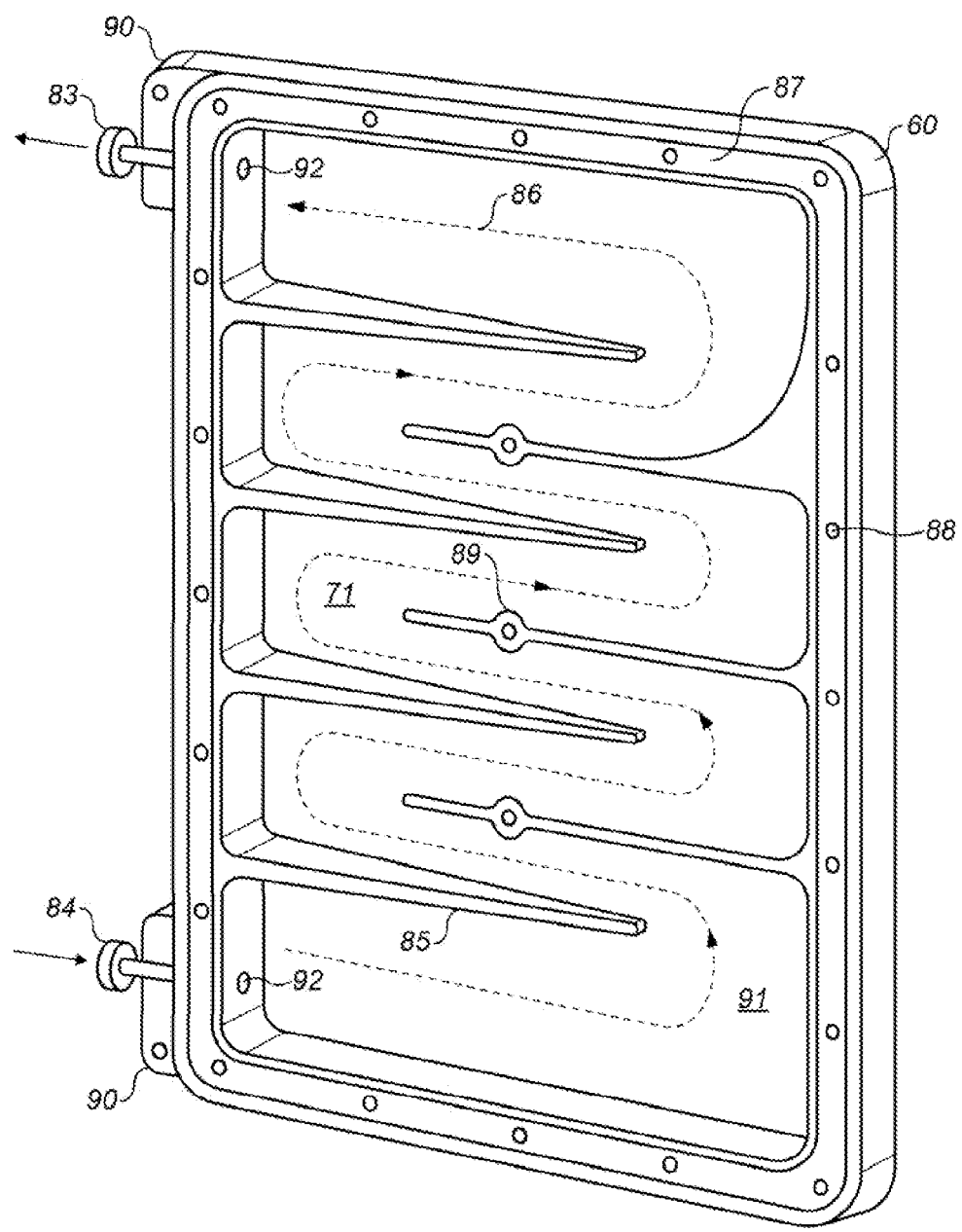
FIG. 7A shows an embodiment of the opposite face of a cold plate from that shown in FIG. 7, showing liquid flow channels for a second cooling liquid, for use with the sealable module of FIG. 5.

Referring now to FIG. 7, there is shown one face of an embodiment of a cold plate 60, for use with the sealable module 41 of FIG. 5. This face provides a pin-finned plate that attaches to housing 81 as shown in FIG. 5 to form a sealable first stage cooling module. FIG. 7A shows the opposite face of the embodiment of the cold plate.

The face of cold place 60 shown in FIG. 7 comprises: conduction surface 71; first pin-fin 96; second pin-fin 97; a channel 87 for a sealing gasket; and holes 88 for assembly screws to attach the housing 81 of FIG. 5. The pin-fins 96 and 97 form projections from the conduction surface 71.

An inlet 84 and outlet 83 for the second cooling liquid are visible in FIG. 7 but connect to the other side of the cold plate. Mounting lugs 90 for the complete module also support the liquid inlet and outlet pipes 83, 84. The pin-fins 96 are of greater height than pin-fins 97. The illustrated pin-fins are examples and the actual layout and size of pin-fins may vary according to the shape and heat-generating characteristics of the components to be cooled.

Turning now to FIG. 7A, there is shown an embodiment of the opposite face of the cold plate 60 to that illustrated in FIG. 7, for use with the sealable module 41 of FIG. 5. Flow directing fingers 85, 89 create channels 91 in the cold plate 60 that form a continuous winding pattern within the boundary of the cold plate 60 and join via holes 92 to tubes that emerge as inlet connector 84 and outlet connector 83 for the second cooling liquid.

The flat part of this side of the cold plate 60 is the opposite side of conduction surfaces 71 shown in FIG. 7. Cover 78 of FIG. 5 is attached to the cold plate by screws that align with holes 88 and is sealed by a gasket that fits in channel 87, so as to enclose the channels 91, thus creating a winding channel arrangement within the assembly. Since the assembled arrangement of channels requires no maintenance, an improved assembly may be constructed by welding the cover 78 directly to the cold plate 60 base part. Adhesive or other techniques for fixing the cover permanently can alternatively be used. Gasket 64 and assembly screws are then not required and the potential for leakage of the second cooling liquid is reduced.

Alternatively, the single winding channel arrangement may be branched to form two or more channels, with common input and output connections for the second cooling liquid. The two or more channels may be of similar or different dimensions, and may be winding or straight, so as to provide a different flow rate of second cooling liquid over different parts of the cold plate.

Figure 7B:
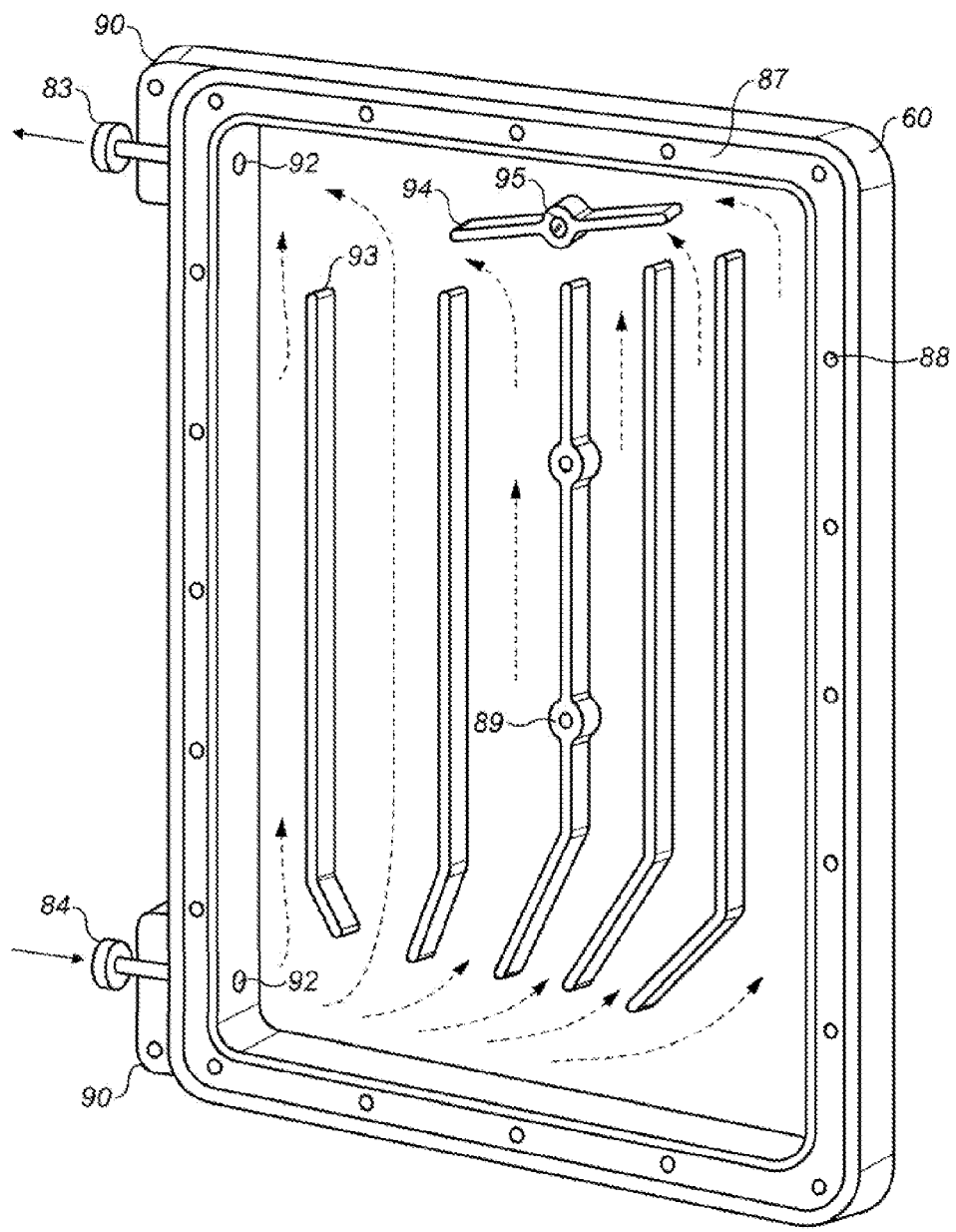
FIG. 7B shows an alternative embodiment of the face of the cold plate 60 shown in FIG. 7A.

Turning to FIG. 7B, there is shown an alternative embodiment of the face of the cold plate 60 shown in FIG. 7A. This illustrates one possible arrangement with several channels, aligned generally in a vertical orientation. The channels are bounded by flow directing fingers 93. The flow of liquid entering via inlet 84 is divided amongst the channels; the flow rate in each channel being dependent on the width of the channel, the shape of the entrance to the channel and the location of the liquid entry hole 92.

Thus, it is possible to arrange the assembly so as to provide similar or different liquid flow rates over different areas and thus different heat transfer rates from different parts of the plate. Electronic components adjacent to the conduction surface on the other side of plate 60 from the channels may generate different amounts of heat. With higher levels of heat production, this may advantageously be made to correspond with the areas with higher rates of heat transfer.

A degree of adjustment may, optionally, be included in the assembly. One or more adjustable baffle plates 94 attached by locking screws 95 may be positioned so as to direct the flow of liquid more towards or away from one of the channels. The baffle plate may be adjusted by slackening screw 95, rotating the baffle plate to a new position and then re-tightening the screw. In this example, the adjustment is made before the cover is attached, although it would be readily possible to add means of adjusting the baffle plate from the exterior of the assembled unit.

Mounting lugs 90 for the complete assembly also support the inlet connector 84 and outlet connector 83.

The material used for the cold plate 60 and conduction surface 71 is chosen to be a good conductor of heat, typically a metal. For ease of fabrication and lower cost in quantity production, a plastic material could be employed with lower but still adequate heat conduction properties. The channels 91 formed within the cold plate 60 are used to carry a second cooling liquid that circulates through the cold plate and then outside to carry heat away to further cooling stages of the system.

The sealable modules 41 provide a first stage of cooling and form part of cooling units, each cooling unit carrying one or more modules. At least one and typically many first-stage cooling units are deployed in a system. The cooling units may be fitted into any convenient housing but, where large numbers are used in a system, conventional equipment racks would normally be used.

Figure 4:
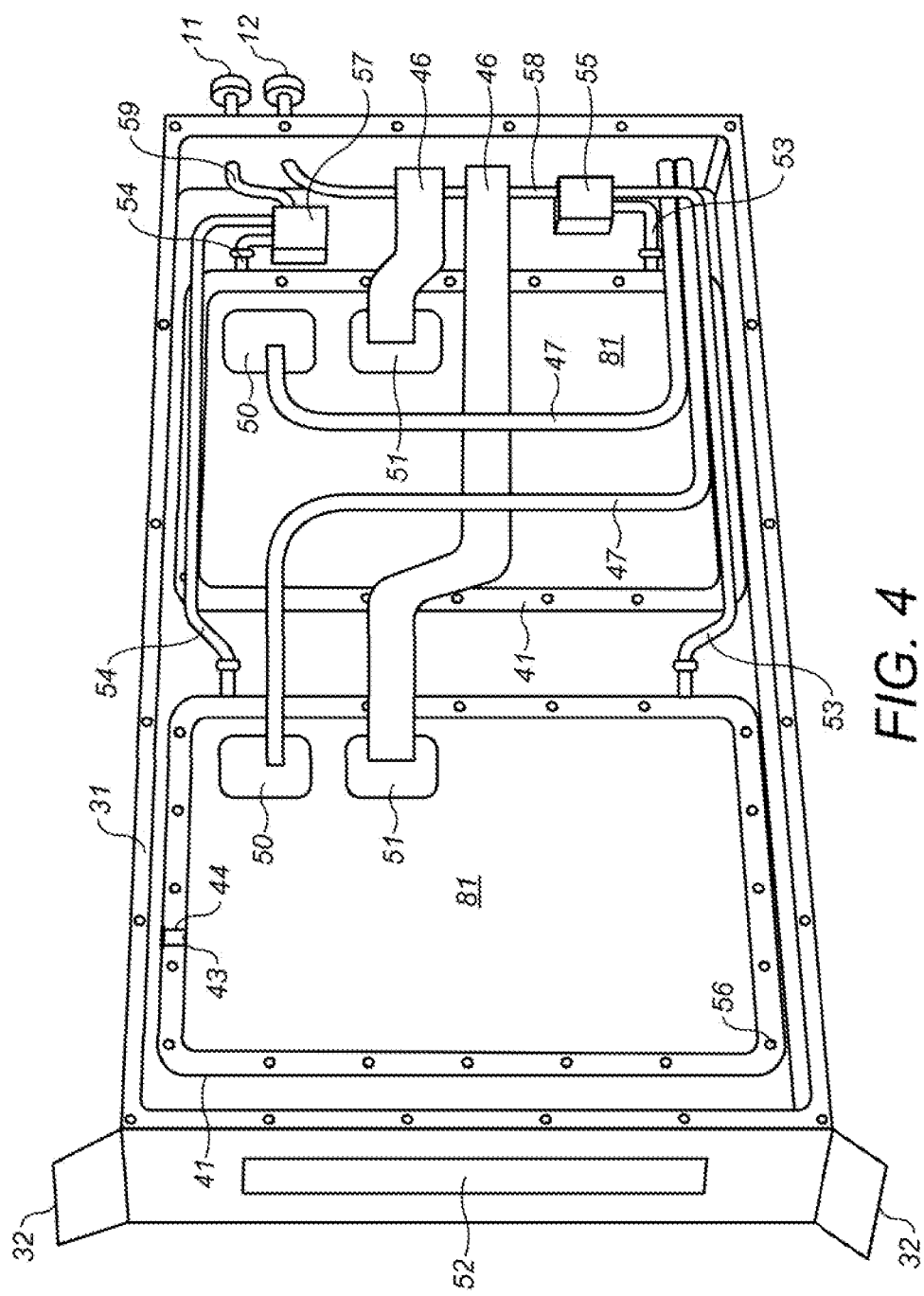
FIG. 4 depicts a cooling unit with its cover removed, showing two sealable modules.

In FIG. 4, there is shown a cooling unit with its cover removed, showing two sealable modules. Where the same features are shown in FIG. 4 as in FIGS. 6 and 7, identical reference numerals are used. In addition is shown: frame 31; locking tabs 32; data transfer cable 46; power cable 47; first seal for cable entry 50; second seal for cable entry 51; and test and monitoring panel 52.

Essentially, FIG. 4 shows the sealable part of each cooling module 41, the remaining part being on the opposite side of the module, separated by the internal cold plate and conduction surface of FIG. 5. The cooling unit comprises a frame 31, which supports cooling modules 41 and various liquid and electrical interconnections. The front panel of the frame 31 carries a test and monitoring panel 52 and locking tabs 32, which can rotate about a hinge so as to lock the unit in place in an equipment rack.

Two sealed modules 41 are shown. The housing 81 for each sealable module 41 is made of plastic or equivalent material, chosen to be an electrical insulator, and to have heat insulating properties, as well as not reacting with the cooling liquid used in the module. Housing 81 is held down by fasteners 56. Cables 46, 47, carrying electrical power and supporting bi-directional data transmission enter the capsule via entry points 50 and 51, sealed to prevent the escape of liquid or the ingress of air. Cables 46, 47 terminate in respective connectors (not shown) at the rear of the cooling unit.

The cold plate side of each module (not shown in FIG. 4) is cooled by a circulating second liquid. Each of the two sealable modules 41 is connected via an inlet pipe 53 for the second cooling liquid, to a liquid flow splitter 55. The liquid flow splitter 55 has two outputs and a common input, connected by a further pipe 58. This splits the flow of second cooling liquid between modules 41 and the common input is connected by a further pipe 58 to liquid input connector 12 on the rear panel of the cooling unit. Similarly, a liquid outlet pipe 54 from each of the two sealable modules carries liquid to a flow-combining unit 57, the common output of which is connected by a further pipe 59 to liquid output connector 11 on the rear panel of the cooling unit.

The assembled sealable module 41 is partly or wholly filled with a first cooling liquid 66 via the filling inlet 44 and then sealed with sealing device 43. The filling procedure may take place during factory assembly or during field installation of cooling modules.

During filling, the sealable module 41 is partly filled with liquid, the remaining space being occupied by a mixture of its vapour and some residual air. One method of achieving this is by heating the liquid and the module to a filling temperature ($T_{fill}$), selected to be well above ambient temperature and approximately the same as the maximum operating temperature of the system ($T_{max}$). The maximum storage temperature of the electronic components is typically much higher than maximum operating temperature, so that $T_{fill}$ can either be below, equal to or above $T_{max}$, the highest envisaged operating temperature of the system.

Liquid is then added to displace most of the air within the sealable module 41, such that the level of liquid is sufficient substantially to immerse all the components to be cooled. The sealable module 41 is then sealed with sealing device 43 to prevent liquid escape and ingress of further air. The sealable module 41 is then allowed to cool to room temperature. The liquid contracts and leaves a space, occupied by liquid vapour and air mixture. The filling procedure may take place in two or more steps, allowing time for liquid that has been added to the sealable module 41 in one step to cool partly before adding more.

At ambient temperature, the vapour and air in the filled and sealed module is thus below atmospheric pressure. This can rise during operation so as be equal to or moderately higher than external atmospheric pressure. A module filled at ambient temperature and then immediately sealed would, during operation and heating to $T_{max}$, be subjected to much higher and potentially damaging internal pressure than one filled by the method described.

The method may, if desired, be extended to exclude all air from the liquid by filling the module completely at $T_{fill}$ and choosing $T_{fill}$ to be higher than $T_{max}$, so that, on cooling, the remaining space above the liquid is filled only with vapour from the liquid at a low pressure below atmospheric. Heating the liquid has the additional benefit of driving out some or most of the dissolved gaseous contaminants that may be present in the untreated liquid.

A further alternative method of filling is to add liquid via filling inlet 44 to the module 41 when both are at ambient temperature, so as to fill to a pre-determined level, sufficient to immerse substantially the electronic components to be cooled. Before sealing with seal 43, the module is then connected to its power supplies and the electronic components set into operation in such a way as to elevate the liquid temperature to or close to $T_{max}$. The module is then sealed, disconnected from its power supplies and left to cool.

Yet another method of filling is under vacuum, such that liquid can be added to the module at ambient temperature, whilst all or most air is excluded. One way of achieving this is to fit a valve and a means of connecting a tube for air to be pumped out and liquid to enter to sealing device 43. The tube opens the valve when connected but releases the valve when removed and allows it to seal the module automatically. The tube has a tee connection, one arm of which is connected to a vacuum pump via a further closable valve. The other arm of the tee connection connects via a flexible tube to a container filled with a pre-determined quantity of the filling liquid. Initially, the container is held at a level where the liquid is below the level of the filling inlet. The ends of the tube make an airtight seal with the module and container respectively. The valve to the vacuum pump is opened and most of the air is pumped out of the module and liquid container. The valve to the vacuum pump is then closed and the container is raised so as to be above the level of the filling inlet. Liquid then flows into the module so as to fill the available space to a pre-determined level and immerse the components to be cooled. Finally, the tube with tee connection is withdrawn from the module and the filling inlet valve seals automatically against ingress of air or loss of liquid. The module has thus been filled with liquid to a predetermined level, leaving a vapour or air space at low pressure, below atmospheric.

An alternative method that is also useful in field filling is to fill with a cool or warm liquid, since there is increased danger of spilling hot liquid. In this case, an air gap is always left above the liquid to allow for expansion. Liquid may be factory prepared to remove dissolved gases and is then stored in sealed containers. The interior space of the sealable module 41 is filled with dry air and the sealing device fitted. When filling the sealable module 41 with liquid, the sealing device 43 is removed, a specified amount liquid is poured into the sealable module 41 via the filling inlet 44 and the sealing device 43 is then immediately refitted. The specified amount of liquid added is sufficient for effective cooling but leaves a remaining space filled with air for expansion of the liquid at temperatures up to $T_{max}$, the highest envisaged operating temperature of the system.

At temperatures below the lowest envisaged room temperature, the liquid may contract further and the electronic circuit board 75 may no longer be fully immersed in liquid. This is envisaged to occur when the module is inactive, in storage or being transported, for example by air, when low external pressure and temperature conditions may occur. The seal 62 between the housing and cold plate is intended to withstand temperature and pressure variations between the limits envisaged for inactivity, storage and transportation and the conditions at $T_{max}$.

Above $T_{max}$, the system would be outside its design temperature range. Although higher temperatures are very unlikely, the pressure relief valve device 45 allows escape of liquid that has exceeded $T_{max}$, the temperature at which the liquid fills or is close to filling the available space inside the module. The pressure relief device may be combined with the seal 43 for the filling inlet 44.

The first cooling liquid 66 is chosen on the basis of a number of desirable characteristics. It should not significantly affect the performance of the electronic circuit board 75 or the transmission of information between the circuit board 75 and other external devices. It should not be corrosive to any component of the cooling module, remain liquid at all operating, storage and transportation temperatures, have sufficiently good specific heat capacity, in order to carry heat away from the electronic components as efficiently as possible, have a high enough coefficient of expansion and low enough viscosity to aid rapid convection, be low-cost, be safe to use and be non-hazardous in case of leakage.

One example of a suitable first cooling liquid 66 is a hydrofluoroether chemical. This has all the desirable characteristics, including a high coefficient of expansion and sufficiently high specific heat capacity to provide high mass-flow rate and rapid convection when heated, thus carrying heat quickly away from the hot components.

Figure 3:
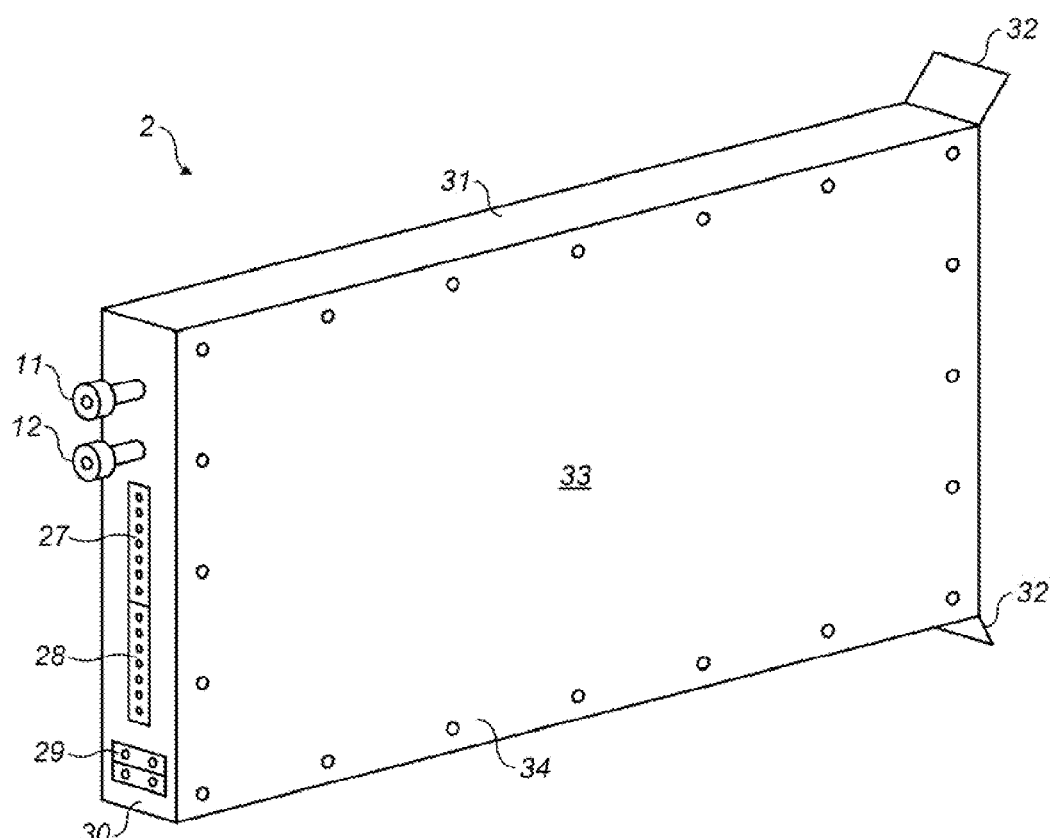
FIG. 3 illustrates a cooling unit, as shown in FIG. 1, fitted with a cover.

In FIG. 3, there is illustrated the cooling unit of FIG. 4, on which frame 31 is fitted with a cover 33 to form an assembled cooling unit 2. Cooling unit 2 further comprises: first data connector 27; second data connector 28; first power connector 29; second power connector 30; and front panel locking tabs 32.

When housed in a standard equipment rack, each cold plate 60, within its respective sealable module 41, is commonly in the vertical plane. Each cold plate 60 carries liquid from inlet 12 also associated with a pair of sealable modules 41 inside the cooling unit 2.

The cover 33 is held in place by screws 34 or equivalent fixings, protects the sealable modules 41 and other internal parts of the cooling unit 2 and gives additional EMC protection. The cover additionally completes an external rectangular box shape that is convenient for sliding into and out of a shelf in a rack for installation, repair or replacement.

Electrical connections are also made at the rear of the module, for power 29,30 and data transfer 27, 28. Standard connectors may be employed to allow connection and disconnection of the module for installation and removal.

Figure 1:
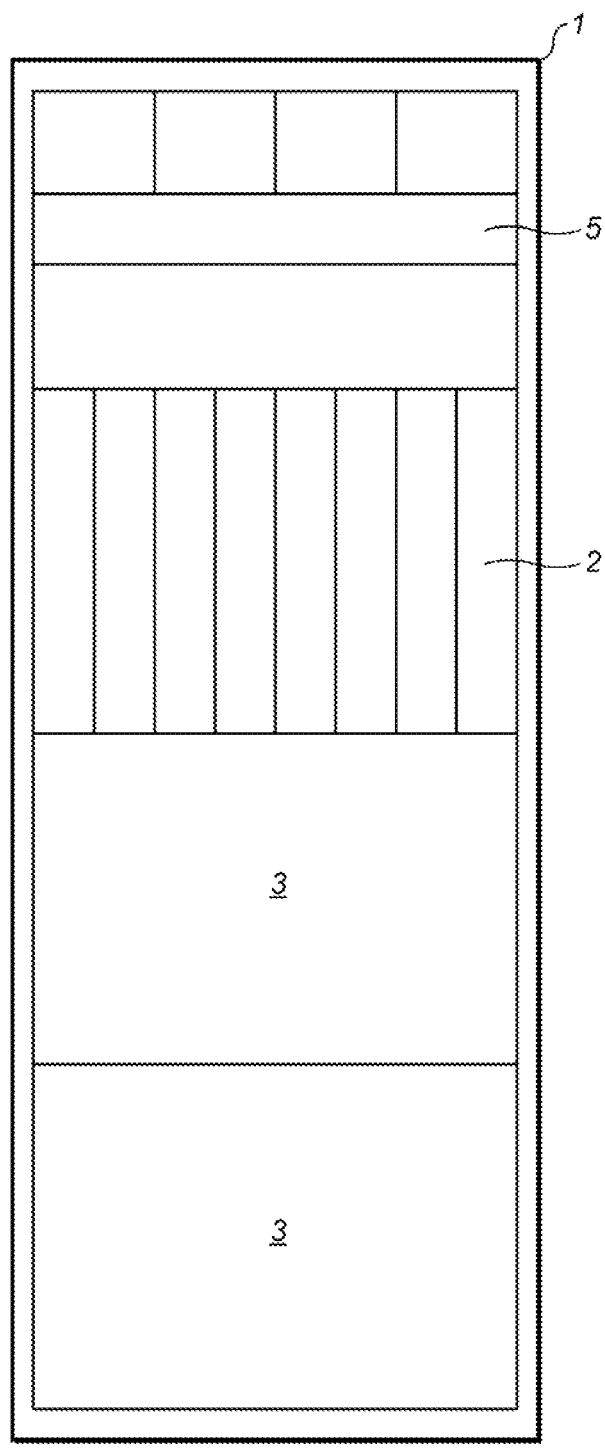
FIG. 1 shows a simplified front view of an equipment rack containing multiple cooling units, each cooling unit comprising two sealable modules.

Reference is now made to FIG. 1, in which there is shown a simplified front view of an equipment rack containing multiple cooling units. Equipment rack 1 comprises: cooling unit 2; additional equipment shelves 3; AC power unit 4, which is commonly air-cooled; and cold plate 5 to provide additional cooling for the AC power unit 4. The AC power unit 4 may alternatively be cooled by immersion in a liquid or by thermal coupling to a cold plate. Rack 1 houses a number of AC power units and cooling modules 2 and has expansion room for further modules in additional equipment shelves 3. The modules are removable for replacement or repair. FIG. 1 shows a typical packing density of modules. Only one shelf 3 of the rack 1 is filled with cooling units 2. The others could be similarly filled with cooling units 2. Cooling units 2 are inserted from the front of the rack.

Figure 2:
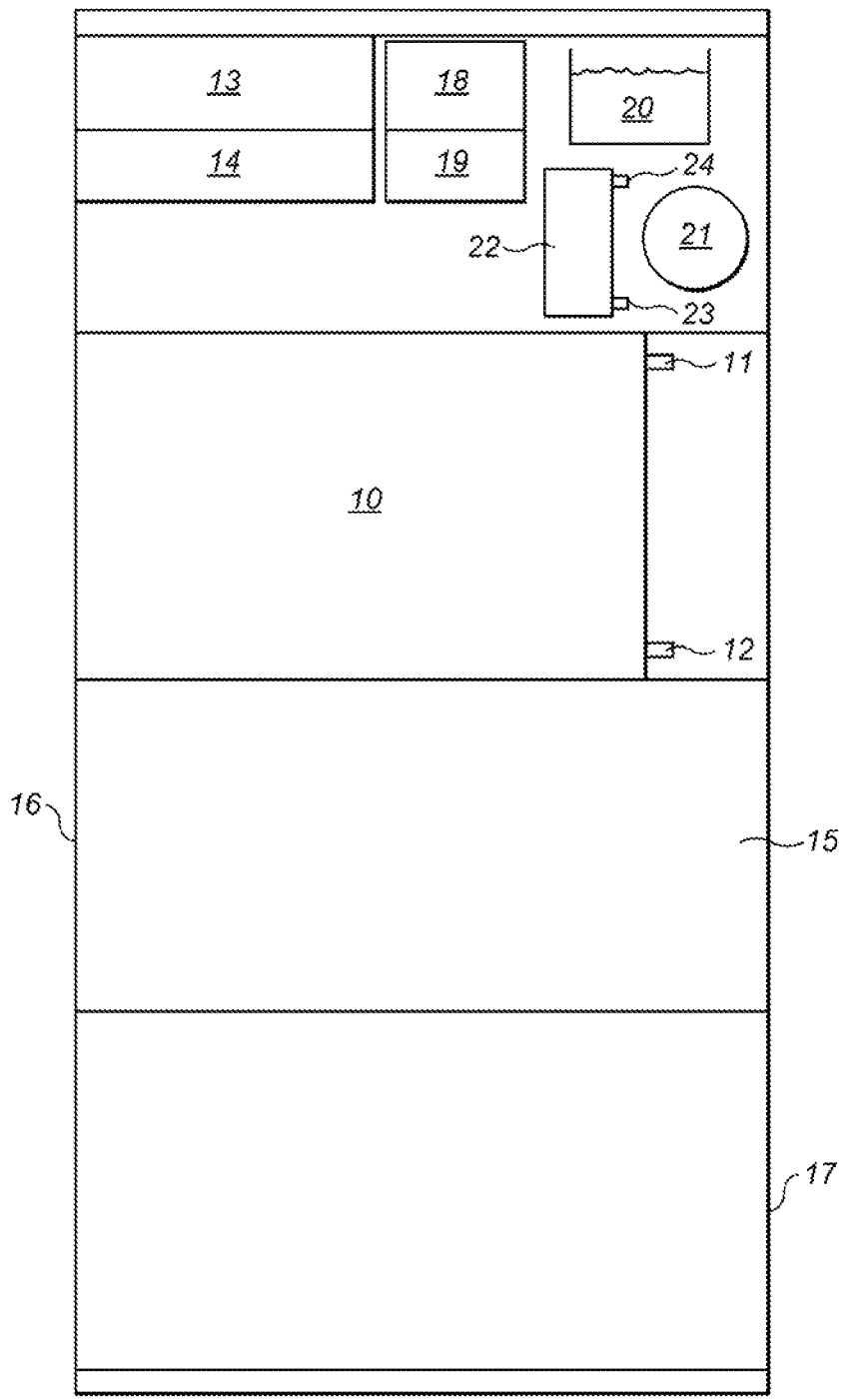
FIG. 2 is a simplified cross-sectional side view of the equipment rack shown in FIG. 1.

In FIG. 2, there is shown a simplified cross-sectional side view of the equipment rack shown in FIG. 1. The front 16, side 15 and rear 17 of the rack 1 are shown.

The equipment rack 1 additionally houses towards the rear: a first plenum chamber 18 (a pressure equalisation device); a second plenum chamber 19; a pump 21; a header tank 20; a heat exchanger 22; a first liquid connector 23; and a second liquid connector 24.

Liquid connections 11 and 12 are also shown on the cooling unit 2. These interconnect with a system of pipes in a second liquid cooling stage of the system, which will be described further below. These are normally at the rear 17 of the rack, although in circumstances where rear access is not convenient, they could be at the front 16 of the rack. In this example, the cooling unit 2 has one liquid inlet and one liquid outlet, serving two independently cooled sealable modules 41 within each cooling unit 2.

The first plenum chamber 18 collects cooling liquid from a number of cooling units 2. The second plenum chamber 19 distributes cooling liquid to a number of cooling units 2. The pump 21 assists circulation of the cooling liquid via the plenum chambers 18 and 19. The header tank 20 is for the cooling liquid circulated by the pump 21. The heat exchanger 22 transfers heat from liquid in the second liquid cooling stage to liquid in a third liquid cooling stage. Liquid connectors 23 and 24 carry liquid in the third cooling stage to and from the heat exchanger to equipment outside the rack.

Thus, a first stage of cooling electronic components has now been described. The first stage provides a low-cost cooling module, using non-forced cooling (in this case using conduction and convection through a cooling liquid to transport heat) and the ability by some means to detach and replace any faulty module with a module that is working correctly. There may be any number from one to a large number of such modules in a system.

In the first stage, at least one sealable module 41 is used. Each sealable module 41 houses one or more electronic circuit boards, power supply units, DC to DC power converters or disk drives to be cooled. Heat is removed from the heat-generating electronic components to the first cooling liquid 66 contained within the sealable module and is then transmitted from the first cooling liquid 66 via the conduction surface 71 to a second cooling liquid flowing through the cold plate base 22.

The second cooling liquid is used in a second stage of cooling and a means of circulating the cooling liquid is provided so as to carry heat away from the first stage. A third stage of cooling can also be used to avoid the use of liquids flowing through cooling units under high pressure.

Further intermediate stages of heat transfer also use liquid to carry heat to a final heat exchanger. Further cooling stages desirably include cooling liquid flow-rate management for the different stages of the system, and pressure management, in order to avoid high cooling liquid pressure in sealable modules, whilst allowing liquid to be pumped effectively to a final heat sink. The system thereby uses multiple stages of heat transfer using liquids in all stages up to the final heat exchanger.

Sufficient heat is removed to keep components within their specified temperature range but not significantly more than that. Additional heat transfer and lower temperatures that allow alternative operating modes such as "over-clocking" of processors are possible using the system but not necessary in normal operation, since additional energy is consumed in achieving these lower operating temperatures and the alternative modes of operation are not in common use in large scale systems.

Figure 8:
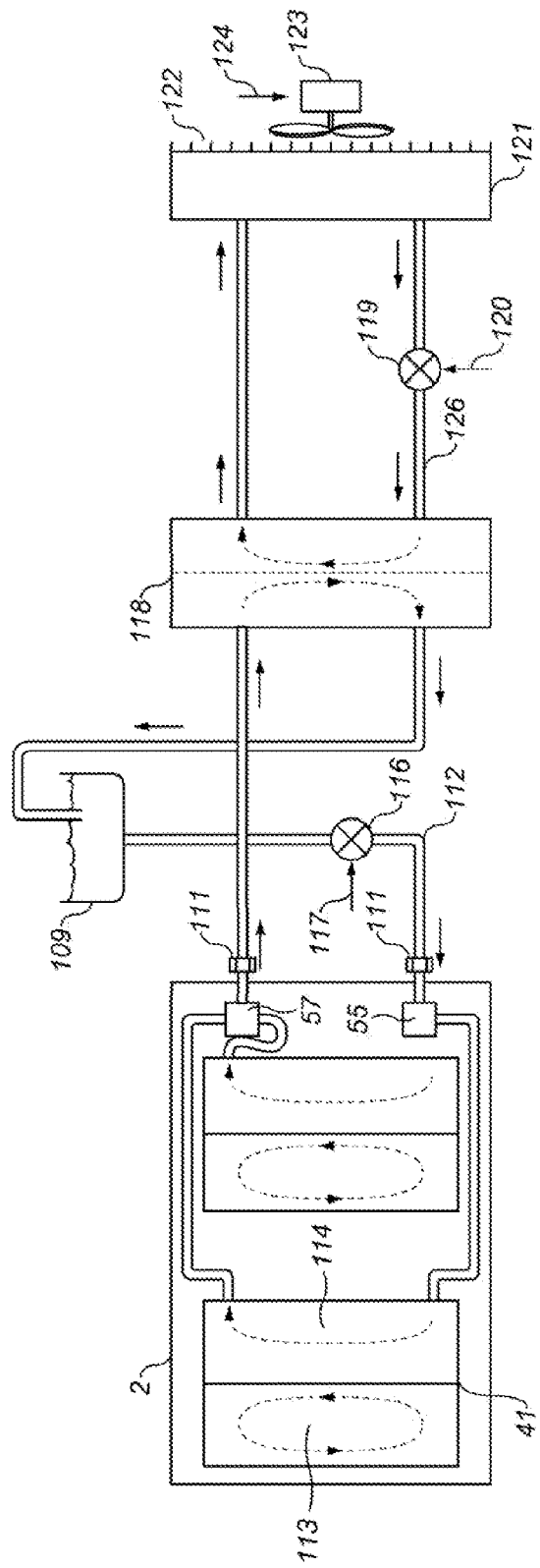
FIG. 8 is a schematic view of a three-stage cooling system comprising a single cooling unit.

Referring now to FIG. 8, there is shown a schematic view of a three-stage cooling system comprising a single cooling unit 2. The cooling unit 2 houses two sealable modules 41, each of which has a first cooling stage 113 using liquid convection and a second cooling stage 114 in which second cooling liquid is circulated outside the cooling unit 2. Liquid flow to the two sealable modules 41 is provided via flow splitter 55 and liquid flow from the modules 41 is combined in flow combiner 57. The system further comprises: quick release connectors 111; pipes for second cooling liquid 112; first pump 116; pump control 117; header tank 109; heat exchanger 118; second pump 119; pump control 120; pipes for third cooling liquid 126; and heat exchanger 121.

Pipes 112 are joined via quick release devices 111 that also contain a means of isolating the second cooling liquid in the cooling module and pipes. When the cooling unit 2 is connected, the liquid can flow normally but when the cooling unit 2 is disconnected, these close off the liquid flow and prevent liquid loss from the module or pipes.

The second cooling liquid circulates through the cold plate (not shown) of the sealable module 41 to a heat transfer device 118 and is then returned to the cold plate via a header tank 109, which regulates the liquid pressure in the second cooling stage so as to be only moderately higher than atmospheric pressure, and a first pump 116 supplied with electrical power from pump control 117, which can be varied to alter the pumping rate according to the amount of heat generated in sealable modules 41 either locally or by means of a control signal from an external device. In the illustrated embodiment, the two cooling circuits within the cooling unit are connected in parallel via splitter 55 and combiner 57. The flow-rate in each of the parallel circuits can be separately pre-adjusted within the splitter 55 and/or combiner 57 to take account of different amounts of heat generated in each arm of the cooling system. The direction of liquid flow is shown by arrows.

The heat transfer device 118 has two liquid flow circuits. The heated second cooling liquid from the cooling module circulates through a first circuit. Cool liquid in the third stage circulates through a second circuit. Heat is transferred from liquid in the first circuit via a heat-conducting interface to liquid in the second circuit, which then flows away through pipes 126 to a final heat exchanger 121. The direction of liquid flow is again shown by arrows.

Heat exchanger 121 comprises: heat exchanger cooling plate 122; fan 123; and power supply 124. This is a conventional device, commonly referred to as a "dry cooler", that may use atmospheric air as the final heat sink medium, this being blown by fan 123 driven by electrical power 124 across a finned cooling plate or equivalent means of heat transfer to cool the circulating third cooling liquid. The cooled liquid is then returned via a pump 119 driven by electrical power 120 to the heat transfer device 118.

The three stages of liquid heat transfer are desirable in situations where the final heat exchanger is located some distance from the equipment to be cooled, for example on the roof of a building. In this case, the pressure difference between liquid circulating through the final heat exchanger 121 and the intermediate heat transfer device 118 may be large. The second stage of heat transfer can use a liquid with a much lower pressure, so that the potential for liquid to leak within the first stage cooling modules and damage the electronic circuit boards is greatly reduced.

Since the second and third cooling liquids are not in contact with the electronic circuit board 75 (not shown), their characteristics are less constrained than those of the first cooling liquid 66. Water, which has the highest specific heat capacity of any common liquid and has very low cost, can be used effectively. An additive to reduce corrosion and bacterial contamination may optionally be used.

The probability of leakage of the second cooling liquid is greatly reduced by limiting the pressure in the second cooling stage. Header tank 109 provides regulation of the pressure in this stage. If any leakage should occur, the fluid may be distinguished from liquid used in the first cooling stage by addition of a small amount of dye. Since the second cooling liquid can be water, a range of low-cost non-toxic dyes is available for this purpose.

Figures 9, 10:
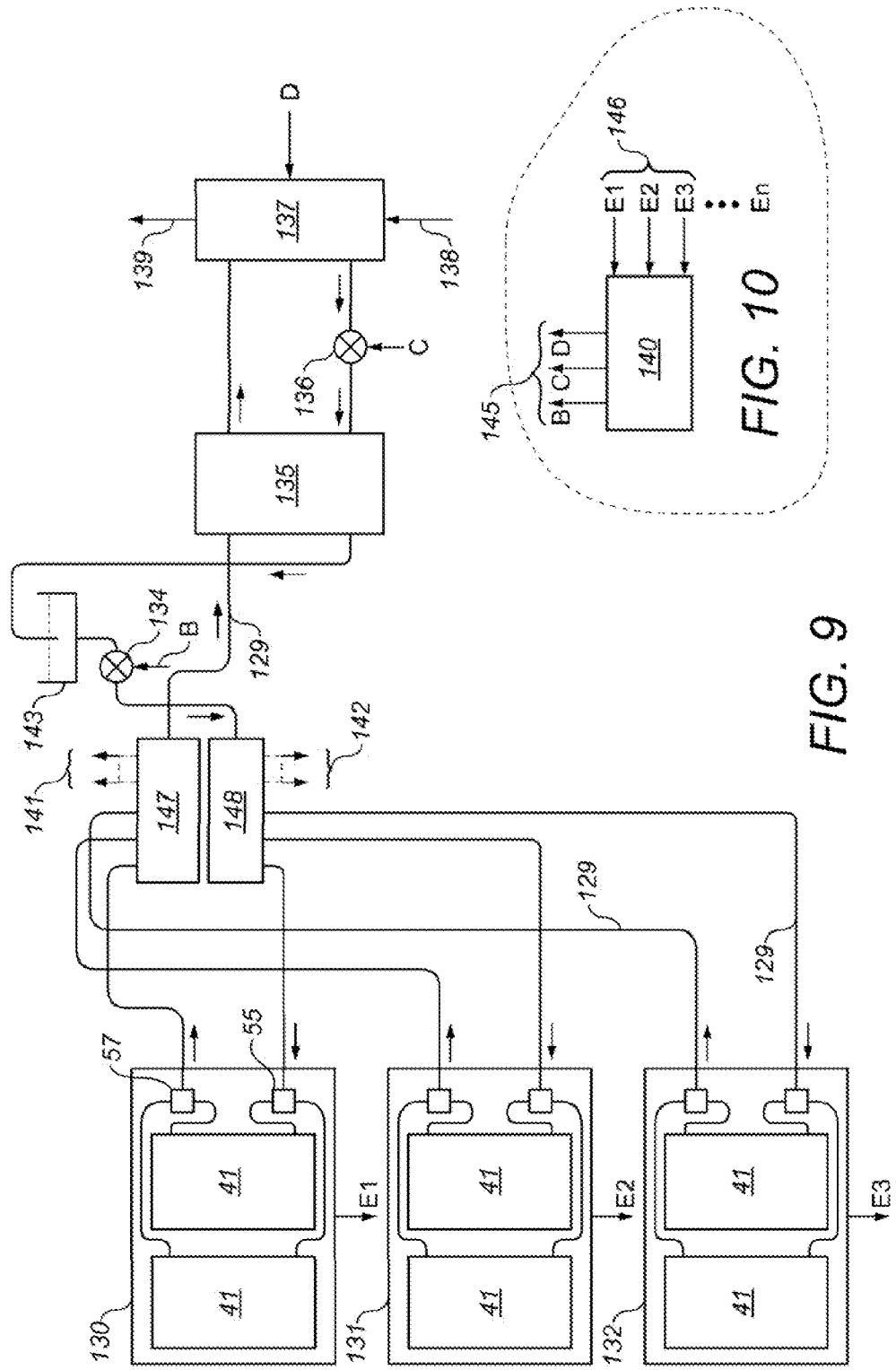
FIG. 9 is a block diagram showing a three-stage cooling system with multiple cooling units.
FIG. 10 shows a monitoring and control system for use with the three-stage cooling system of FIG. 9.

Referring now to FIG. 9, there is shown a block diagram showing a larger scale three-stage cooling system with multiple cooling units according to the invention. Three cooling units, each with two sealable modules according to the invention are shown but, typically, many more units can be accommodated in a system. This example of a larger scale cooling system, comprises: cooling units 130, 131, 132; pipes 129; plenum chamber 147 to combine liquid flow from cooling units; plenum chamber 148 to distribute liquid flow to cooling units; pump 134 for second cooling liquid; header tank 143; heat exchanger 135; pump 136 for third cooling liquid; final heat exchanger 137; final coolant entry 138 to final heat exchanger; and final coolant exit 139 from final heat exchanger.

A number of cooling units 130, 131, 132 are mounted in a housing or rack with an arrangement such as that shown in FIG. 1. The liquid flow through the cooling units 130, 131 and 132 is connected in parallel fashion via plenum chambers 147 and 148. Each of the cooling units 130, 131 and 132 typically contains two or more sealable modules 41 and can be disconnected and removed from the rack separately, using quick release connectors such as those shown in FIG. 8, for replacement or repair. The number of cooling units can be extended, as indicated schematically via the additional inputs 141 and outputs 142 of the plenum chambers to a large number.

Plenum chambers 147 and 148 are advantageously insulated to improve efficiency by reducing local heat loss and reducing transfer of heat between the input plenum and the output plenum. A further improvement is to locate plenum units directly in line with the connectors of cooling units 130, 131, 132, thus simplifying pipe arrangements and reducing the total number of liquid connectors in a system.

The second cooling liquid flow is divided amongst the cooling modules by a parallel arrangement of pipes 129 from plenum chamber 148, typically with one set of pipes per cooling unit, each serving two sealable modules 41 mounted therein. The flow rate to each sealable module 41 can be varied by use of restrictors and baffle plates in the plenum chamber 154

By adjusting the flow rate to each cooling unit independently, a more efficient system is produced with a more uniform temperature of the heated second cooling liquid from the various cooling units.

Heated liquid from the cooling units is returned via pipes 129 to plenum chamber 147, where it is combined and delivered via pipes 129 to heat exchanger 135. Cooled liquid from heat exchanger 135 is passed to header tank 152, which regulates the pressure of the second cooling liquid.

Pump 134 drives the circulation of the second cooling liquid by drawing liquid from the header tank and pumping it to plenum chamber 148. The liquid is then distributed back to the cooling units via pipes 129. Pump 134 may be similar to pump 116 of FIG. 8, but is desirably of a larger scale to pump liquid to several cooling units 130, 131, 132 instead of one. Arrows show the direction of liquid flow. Heat transfer device 135 has the same function as the heat transfer device 118 of FIG. 8, except that it is desirably of a larger scale to transfer heat from several cooling units 130, 131, 132 instead of one.

The third stage of the system uses a third cooling liquid to transfer heat from the heat exchange device 135 to a final heat exchanger 137. Pump 136 is used to circulate the liquid. Atmospheric air or cool groundwater, used as the final heat sink medium, enters the heat exchanger at 138 and leaves at 139. In this case, and especially in systems that cool large arrays of servers, the entropy of the liquid carrying the heat may be low enough to be used for other purposes, rather than be dumped into the environment. It may be used as a source of energy for heating a building for human occupation or the generation of useful amounts of electrical power. In other circumstances, where an unusually high atmospheric temperature would otherwise reduce the temperature difference between the source and atmospheric final heat sink to too low a level, excess heat may be diverted (by diverting some of the final liquid) to refrigeration ("chiller") units, or additional energy or cost might be expended in the final heat exchanger (such as the use of adiabatic "dry coolers", which spray water into the air to reduce the effective ambient temperature, wet bulb temperature).

FIG. 9 also shows signal outputs E1, E2, E3 from cooling units 130, 131 and 132. Further signal outputs (not shown) may be provided by additional cooling units so that the full set is E1, E2, E3 . . . En. Also shown are control inputs B and C to pump 134 and pump 135 respectively, and control input D to final heat exchanger 137. These can be used for monitoring and control purposes. This will be explained in more detail below.

Referring now to FIG. 10, there is shown a monitoring and control system 140 for use with the three-stage cooling system of FIG. 9. The system comprises: data inputs 146; and pump control outputs 145.

A monitoring and control system is used to monitor the temperatures of the electronic devices to be cooled and to adjust the flow rate of the second cooling liquid, third cooling liquid or both to provide optimum cooling. Sensors on each electrical circuit board measure the temperature of the electronic components and convert this information to analogue or digital signals. FIG. 9 shows signal outputs E1, E2, E3, which can be extended to En, where n is the total number of cooling units that contain temperature-sensing devices, and where each signal contains information about the temperature of the one or more sealable modules in each cooling unit. These outputs are sent to the control system 140.

The control system 140 computes the optimum flow rate of second cooling liquid, the optimum flow rate of the third cooling liquid and the rate at which the final heat exchanger should operate and produces in response a control message B, C, D. Control messages B and C are used to turn on or off or vary the pumping rate of pumps 134 and 136 respectively. In addition, the control system determines whether or not the final heat exchanger needs to adjust its cooling rate, for example by altering the flow level of the final heat sink liquid or air, using control signal D.

The overall thermal capacity of the system is large, so that short term relatively large increases in ambient temperature (and thus the temperature of the final heat sink) can be accommodated without the key components exceeding their maximum temperature ratings. The ambient temperature on the hottest days may rise to a level where not all of the heat generated by the components to be cooled can be removed. The operating temperature of components may rise but the high thermal capacity means that the rise takes place slowly and maximum temperatures are not exceeded. During the cooler part of the diurnal cycle, more heat can be removed than is generated. In this way the system can be operated at locations with climates that would not otherwise allow refrigeration-free cooling. The control system can be optimised to use ambient temperature data, measured from external sensors and from historical trend data and statistics, to ensure that the flow rates are optimised. In the rare event that very exceptional temperatures occur, timely warning can be given to either reduce the effective temperature of the final heat sink (such as by switching to an active mode of cooling) or otherwise enable the system operator to take appropriate remedial actions.

In systems where "run-time hardware abstraction" of processing systems is used (such as with "virtualisation" or "run-time middleware"), the monitoring and control system is particularly important. In systems with hardware abstraction, the multiple electronic circuits boards ("hardware") and multiple computer operating systems are not in one to one correspondence. When one circuit board is under high processing load, some activity can be shared with other boards. Processing is distributed across the items of hardware. As a result, heat generated in different parts of the systems varies from time to time. Cooling rates in different parts of the system may then be adjusted dynamically to align with the changes in amounts of heat generated.

If the first cooling liquid in the sealable module 41 (and thus, the circuit board 75) is to operate at a desired temperature, $T_{case}$, and the final heat sink is at a known temperature $T_{hs}$, this defines the temperature difference that the cooling system desirably provides, in that $\Delta T = T_{case} - T_{hs}$. Since $T_{case}$ is desirably restricted to no higher than the maximum operating temperature of the circuit board, $T_{case,max}$, then $\Delta T \leq T_{case,max} - T_{hs}$.

Semiconductor manufacturers are increasingly reducing the maximum operating temperature of their processors. This reduces the temperature difference, particularly when refrigeration is not employed to increase the local temperature difference. A further difficulty arises when the final heat sink is at atmospheric temperature, which may be as high as 40 degrees centigrade.

Reducing the thermal resistances in the system can assist to achieve the desired temperature difference. Systems which transfer heat through fluid flow may result in reduced thermal resistance compared with systems which transfer heat, either in full or in significant part, through static, thermally-coupled bodies or through gases. For example, the flow rate of the second cooling liquid can be adjusted to reduce the thermal resistance between the sealable module 41 and the heat exchanger 118. Additionally or alternatively, the area of contact between the second cooling liquid flowing through the channels 61 and the conduction surface 71 can be varied to affect the thermal resistance.

The use of tightly-packed channels 61 increases the pressure drop (i.e. hydraulic pressure losses) in the cold plate which increases the pumping costs for the secondary cooling liquid circuit. The width of the channel can be modified to reduce pressure losses and decrease the effect of the conduction surface 71 in the cold plate 22 in transferring heat into water channels.

At one extreme, the channels 61 could be as wide or wider than the dimensions of the housing 81 to present a "flood plain", rather than a "serpentine river", of second cooling liquid. However, controlling flow of second cooling liquid in such an embodiment may be difficult and features such as eddy currents may cause local build up of heat, which is undesirable as it will reduce rate of heat transfer for adjoining areas of conduction surface 71.

Therefore, the channel 61 width can be less than, but significant in comparison with a dimension of the housing 81. Optimisation of the cross-section of the channels 61 can improve the temperature difference. Channels 61 that are approximately 20% of the length of the longest channel 61 may be defined by baffles that direct flow over specific areas. Also, the flow of the second cooling liquid can be portioned with the channels 61 into sections such that the water is distributed into zones and slowed over areas with greatest heat flux (e.g. processors), the reintroduction of heat back into the primary coolant can be minimised, whilst the entropy of the extracted heat can be minimised.

Whilst a preferred embodiment and operating modes have been described above, the skilled person will appreciate that various modifications can be made.

For example, cold plate 5 shown in FIG. 1 is optional and the skilled person will appreciate that this need not be included. Instead of inserting cooling units 2 into the equipment rack 1 from the front, they could be inserted from the rear of the rack. Advantageously, the cooling units could be adapted to carry only one sealable module in each unit, so that units may then be inserted both at the front and rear of the rack. Electrical and liquid connections are then made in the middle of the rack. A single module unit is much lighter in weight than a two module unit and can be safely carried, fitted or removed by a single person.

Although intermediate stages of heat transfer and a final heat sink may use liquid cooling, other cooling mechanisms can alternatively be used, such as convection cooling.

Figure 11A:
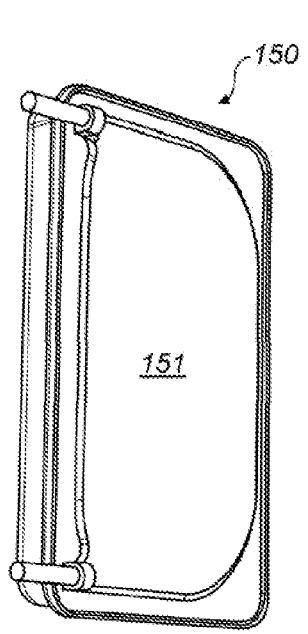
FIG. 11A shows a first side view of a second embodiment of a sealable module.
Figure 11B:
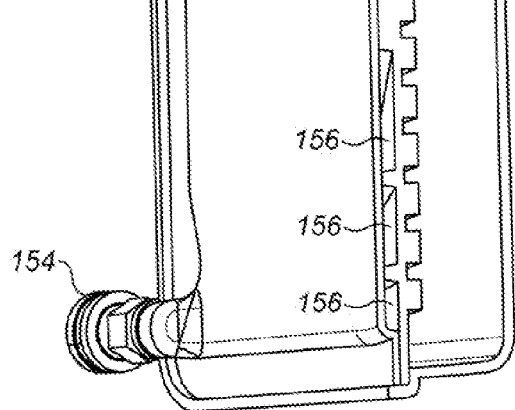
FIG. 11B shows a second side view of the embodiment shown in FIG. 11A.

The skilled person will also recognise that this can be implemented and operated in a number of different ways. Referring now to FIG. 11A and FIG. 11B, there are shown side views of a second embodiment of a sealable module 150, which is an alternative to that described above. The sealable module 150 comprises an outer cover 151 and housing 152. Although the second embodiment differs slightly from the first embodiment, the skilled person will appreciate that many features of the two embodiments are interchangeable.

The channels in the cold plate 60 are closed by the outer cover 151. The assembly, which defines the channels, can be termed a "water jacket", because it dictates the flow of water (as second cooling liquid) for heat to flow over a heat transfer surface, such as a conduction surface 71.

Figure 11C:
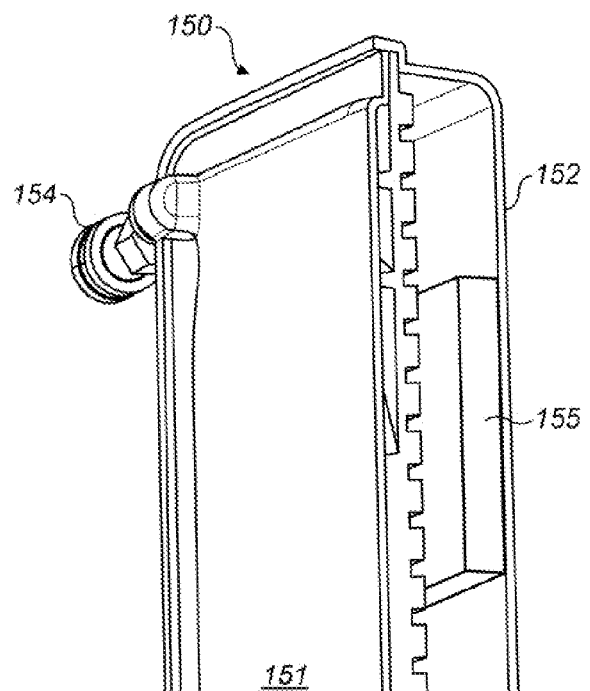
FIG. 11C shows a more detailed view of the embodiment shown in FIG. 11A and FIG. 11B.

Referring now to FIG. 11C, there is shown a more detailed view of the sealable module according to FIG. 11A and FIG. 11B. The sealable module 150 also comprises a heat transfer surface 153, which together with the outer housing 151 defines channels 156. Also, the heat transfer surface 153 and lid 152 (which can be termed a base or housing) define an inner chamber with an internal volume for locating the electronic device 155 to be cooled and the first cooling liquid (not shown). Connectors 154 are also shown, for allowing flow of the second cooling liquid through channels 156.

This alternative embodiment of a module may therefore comprise an inner housing, containing the first cooling liquid and one or more motherboards, substantially sealed (except for a filling port). A heat transfer surface 153 has a gasketed interface with the inner housing and fins facing into the first cooling liquid, shaped to match the profile of the at least one motherboard. The outer housing 151 also has a gasketed interface with the heat transfer surface 153, and contains at least one secondary cooling liquid circuit channel 156, formed with baffles on the heat transfer surface 153 or on the interior surface of the outer housing 151. The at least one channel 156 is optimised to direct the second cooling liquid appropriately over the heat transfer surface 153 with minimised pressure loss. The outer housing 151 has quick-connect hydraulic connectors 154 to enable the channel 156 to be connected to the inlet and the outlet of a rack second cooling liquid supply.

This design allows much tighter integration between the inner housing, heat transfer surface 153 and outer housing 151 potentially to make a smaller unit, which may allow increased packing density of modules. Fins or baffles may be provided on both sides of heat transfer surface 153. These can, for example, provide additional flow control of second cooling liquid and increase surface area for conduction.

The materials for the present invention can be varied. Metal materials are good conductors, but expensive. Also, if the heat transfer surface 153 or conduction surface 71 (which can be similar or identical) are made of metal and are large, they may be more likely to warp, putting stress on seals, especially if multiple sealable modules are mounted thereon, meaning areas of potentially different temperature.

In contrast, synthetic plastic materials are inferior conductors in comparison with metal. Known thermally conductive plastics typically conduct 20 W/mK compared to 141 W/mK for aluminium. Higher performance thermally conductive plastics are also usually electrically conductive, which is not a desirable characteristic. However, these materials are less expensive, of lighter weight and are less likely to corrode in the presence of hot water (notwithstanding the possible addition of corrosion inhibitors to the second cooling liquid) than metals.

Optimisation of the temperature difference by control of second cooling liquid flow rates, area of heat transfer and channel cross-section can allow the use of plastic without significant reduction in the temperature difference. In particular, plastic can be used for the base part 22 of the cold plate or the outer housing ("water jacket") described above. A plastic material reduces the amount of heat transferred through the outer wall of the base part 22 or outer housing 151 and into the local ambient environment, reducing heat lost in this way and increasing efficiency of heat removal into second cooling liquid.

Additionally or alternatively, the conduction surface 71 or heat transfer surface 153 can be made of plastic. This may provide additional expansion capacity for the first cooling liquid within the sealed housing. Such a material might be co-moulded with a rigid central thermal conductive plastic and peripheral ring of flexible non-conductive plastic.

A number of features of the embodiment described above will be understood as optional to the skilled person and might be omitted. These may include insulation 73, which could additionally be made of a fire retardant material and quick release connectors 111. Also, the skilled person will understand that alternative constructions for the cold plate 60 or outer housing 151 can be used and that the projections 96, 97 can be of different length and cross-section to that described.

Although an embodiment described above uses a cooling unit 2 in which one sealable module 41 is affixed to a cold plate 60, it will be recognised that two or more sealable modules 41 might be coupled to a common cold plate. Also, cooling units 2 may be inserted from both back and front of the rack.

The electronic circuit board can be combined with housing 81 to form an integrated assembly. This provides a means of connection to electronic components directly from the circuit board, thus reducing the risk of liquid leaking from cable seals in the module, reducing the overall width of a sealable module and increasing packing density of cooling units within a rack.

The data transmission cables 46 can be replaced by fibre optic cables, optical or infra-red ports or wireless connection between the electronic circuit board and the exterior of the sealable module. Power supply connections would normally be wired, even when the data transmission is by other means, although alternative power supplies may be employed, whilst avoiding fluid leakage.

The second cooling liquid may be distributed via pipes with individual flow control valves, rather than a plenum chamber. The valves may be locally adjusted or controlled automatically by a central monitoring and control system similar to control system 140 shown in FIG. 10 in response to temperature and status information from the components housed within the sealable modules 41. Also, in the system of FIG. 8, heat exchanger 121 can alternatively be replaced by cool groundwater or a number of configurations including bypass circuits to transfer some heat to refrigeration systems. To provide resilience and redundancy additional "back-up" pumps and circuits may optionally be provided.

In particular, a cooling system with redundancy can use a heat exchanger arrangement that receives the liquid coolant, transfers heat from a first portion of the liquid coolant to a first heat sink and transfers heat from a second portion of the liquid coolant to a second heat sink. However, the first and second heat sinks are isolated from one another.

Figure 12:
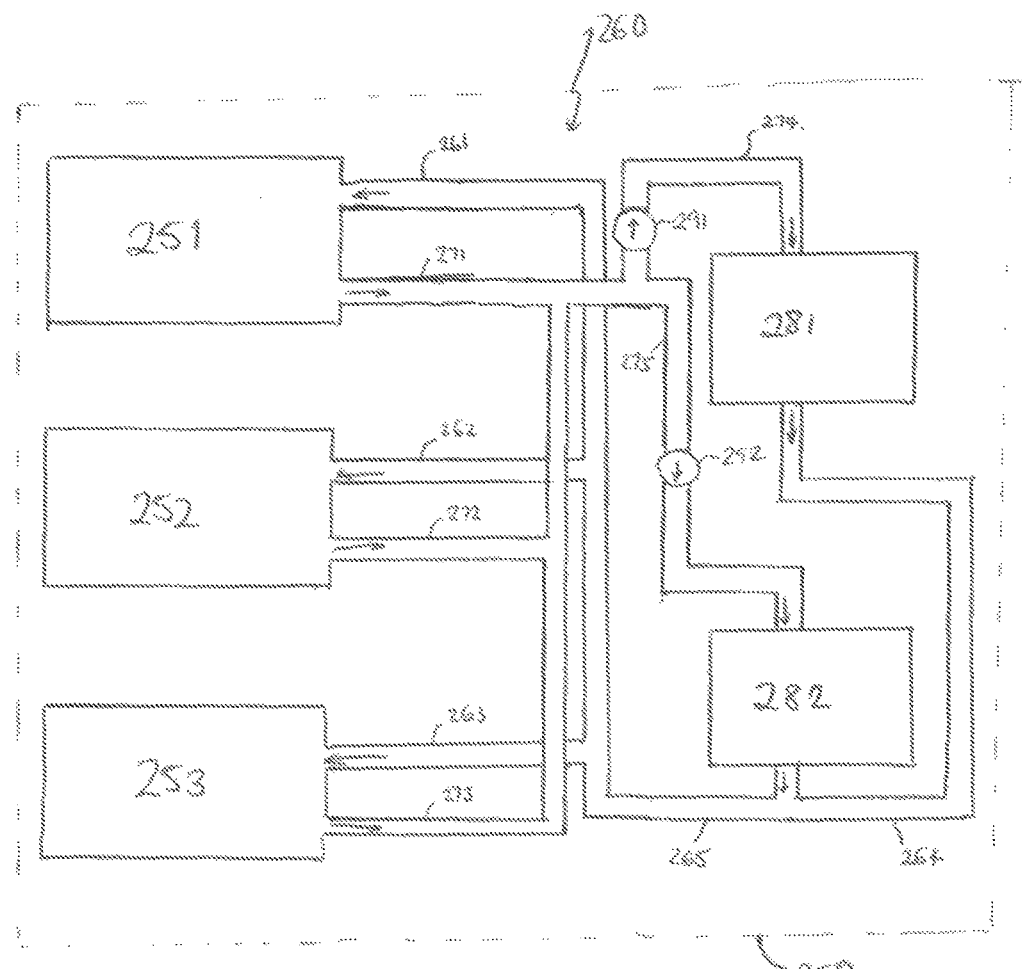
FIG. 12 depicts a schematic diagram of a cooling system with cabinet-level redundancy.
Figure 18:
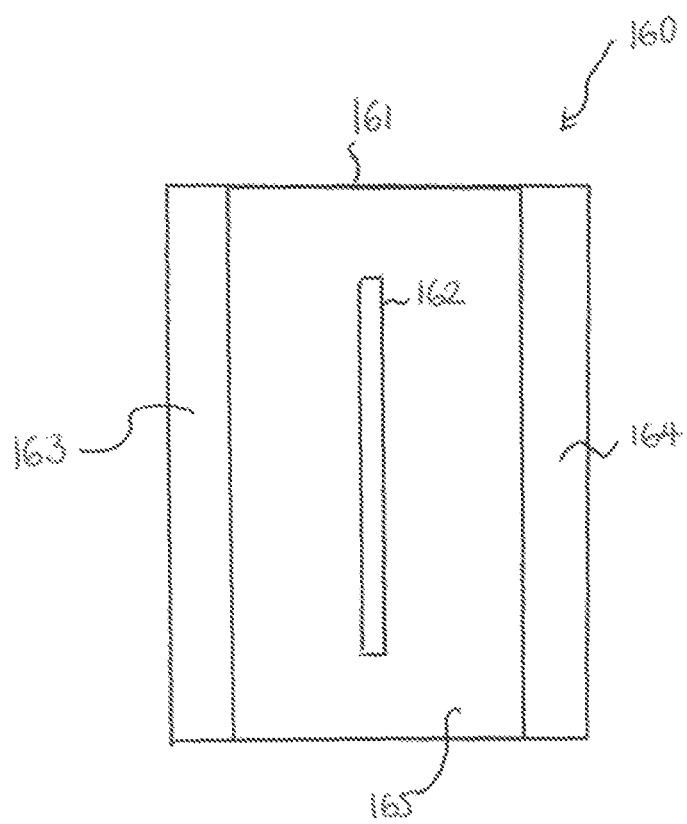

Referring to FIG. 12, there is depicted a schematic diagram of a cooling system with cabinet-level redundancy. It should be noted that this diagram shows a simplistic and schematic understanding of the system, as additional components may be required, some of which are identified below.

The cooling system is housed within a cabinet 250 and may comprise: a first module 251; a second module 252; a third module 253; a piping system 260; a first heat exchanger 281; a second heat exchanger 282; a first coolant pump 291; and a second coolant pump. Although three modules 251, 252, 253, two heat exchangers 281, 282 and two coolant pumps 291, 292 are shown, this is for illustration purposes only and it will be understood that fewer (down to even one) or more modules may be used, more than two heat exchangers and fewer or more than two coolant pumps are possible. Each of the modules may be in accordance with sealable modules described above. Although reference here is made to cabinet-level redundancy, it may be understood that not all of the components need be contained within a single cabinet, although it is preferable that at least the multiple modules are housed within one cabinet.

The piping system 260 may be used for receiving warmed liquid coolant from the modules. The first module 251 has a liquid output port 271, the second module 252 has a liquid output port 272 and the third module 253 has a liquid output port 273. In this embodiment, the output liquid coolant is combined (a plenum chamber, not shown, can be used for this purpose, as discussed above), but this is not necessary. The piping system 260 separates the combined liquid coolant into two portions, the first portion of the coolant being carried by a first output pipe 274 to the first heat exchanger 281 and the second portion of the coolant being carried by a second output pipe 275 to the second heat exchanger 282.

The first and second portions of the liquid coolant are thereby transferred to a heat exchanger arrangement made up from the first heat exchanger 281 and the second heat exchanger 282. Each of the two heat exchanges 281, 282 transfers the heat received to a respective heat sink (not shown). These heat sinks may comprise further coolants, which may be fluid and possibility liquid, and separate fluid coolants can optionally be combined downstream. A subsequent stage heat exchanger system can optionally be provided to receive the multiple heat sink coolants and to transfer heat from these coolants to a common output heat sink. Redundancy in the pumping of the sink coolant or coolants can be effected, for example by providing two or more pumps in series or in parallel. It will be appreciated that other forms of heat exchanger arrangement may be possible which transfer two separated portions of the liquid coolant to two separate heat sinks, isolated from one another.

A similar configuration is shown for the transfer of the cooled coolant from the two heat exchangers back to the sealable modules via the piping system 260. A first portion of the coolant is carried by a first input pipe 264 from the first heat exchanger 281 and a second portion of the coolant is carried by a second output pipe 265 from the second heat exchanger 282. The cooled coolant is then transferred back to the modules. The first module 251 has a liquid input port 261, the second module 252 has a liquid input port 262 and the third module 253 has a liquid output port 263.

This use of multiple heat exchangers for the warmed coolant that is output by one or more modules allows redundancy, for load sharing and particularly to cope with possible failure of one or more component, especially a part of the piping system 260 or one of the heat exchangers. In the event that one heat exchanger is unable to transfer heat to its heat sink, another heat exchanger is configured to transfer at least some (or all) of the heat that would have been transferred away to another heat sink.

The heat exchangers can be configured to transfer an approximately equal proportion of the heat received from the modules to the first heat sink as the second heat sink. In other words, the heat exchanger arrangement may divide the heat output between the two heat sinks roughly equally, such that the two share the load. However, the ratio of heat transfer may be controlled or may be set differently (for example, 45%:65%, 40%:60%, 35%:75%, 30%:70%, 25%:75%, 20%:80%, 10%:90%, 5%:95%). The capacity of the first heat sink and the second heat sink may be the same in many embodiments.

Redundancy can additionally (or alternatively) be provided in respect of pumps, by use of independent pumps. In FIG. 12, the first pump 291 is placed in the first output pipe 274 and the second pump 292 is placed in the second output pipe 275, but other arrangements are possible and the pumps need not be placed in separated portions of the piping system 260. When the final heat sink 121 is close to the equipment to be cooled and the pressure of the cooling liquid circulating in this stage can be lower, a second stage of cooling might be omitted. In this case, the second cooling liquid circulates directly through the final heat exchanger. Pump 116 and intermediate heat transfer device 118 or 135 are omitted. As with the embodiment illustrated in FIG. 8, the three-stage system shown in FIG. 9 could be reduced to two stages if the liquid pressure in the final stage were low enough.

Further improvements to the cooling system configuration described above for more complex cooling systems are also contemplated. In particular, data processing or computer server centres use electronic components with increasing greater heat output, requiring more cooling power than before. At the same time, redundancy is added to the cooling system to avoid failures of specific components or processes causing a breakdown of a portion or the whole of the system. Adding such redundancy increase costs and can reduce overall efficiency.

Referring to FIG. 13, there is shown a cooling apparatus 160, comprising a housing 161; a heat generating electronic component 162; a first heat exchanger 163; and a second heat exchanger 164. The housing 161 (optionally in conjunction with the first heat exchanger 163, second heat exchanger 164 or both) defines a volume 165, in which the heat generating electronic component 162 is located.

Prior to operation, the volume 165 is filled with a liquid coolant. WO-2010/130993 and US-2010/0290190 describe techniques for filling a volume such as volume 165 with liquid coolant, in particular accounting for any pressure changes during operation. The sealable module 160 is sealed such that the liquid coolant should not escape.

During operation, the heat generating electronic component 162 heats the liquid coolant in the volume 165 and heat is transferred from the liquid coolant to heat sinks exterior the sealable module 160 via the first heat exchanger 163 and the second heat exchanger 164. The respective heat sinks for the first and second heat exchangers are isolated from another. In this context, the term heat sink is used simply as a shorthand for the device or arrangement through which heat is transferred away from the sealable module 160.

Implementation details of one embodiment in accordance with FIG. 13 are now discussed. In that context and with reference to FIG. 14, there is shown a cross-sectional exploded view of an embodiment of a sealable module comprising a heat generating electronic component in accordance with FIG. 13. This embodiment is largely based on the design shown in FIG. 5. Where the same components or parts as shown in FIG. 5 are used, identical reference numerals have been employed.

The sealable module 170 comprises a heat generating electronic component 185. It further comprises: a first finned conduction surface 71 forming part of a first cold plate 60; first liquid flow channels 61 adjacent the conduction surface 71; a second finned conduction surface 186 forming part of a second cold plate 180; and second liquid flow channels 181 adjacent the second conduction surface 186. Fixings are omitted from this drawing, for the sake of clarity.

As per FIG. 5, the heat generating electronic component 185 comprises: a circuit board 75; a small electronic component 68; a large electronic component 76; and a rear-mounted electronic component 184.

The sealable module 170 further comprises: a first sealing gasket 64; a second sealing gasket 182; a third sealing gasket 188; pin-fin projections 65 on the first conduction surface 71; pin-fin projections 183 on the second conduction surface 186; a first cover plate 78 for the side of the first cold plate 60 opposite to the fins on the first conduction surface 71; and a second cover plate 187 for the side of the second plate 170 opposite to the fins on the second conduction surface 186.

Each of the first cold plates 60 and second cold plates 180 are fabricated with two faces, each with a separate function. The first conduction surface 71 and the second conduction surface 186 are a pin-finned plate, forming one face of the respective cold plate. The two cold plates may be attached together, as shown in the drawing, in order to create a sealed volume in which the heat generating electronic component 185 may be housed. The sealing gaskets ensure that the assembled capsule is substantially sealed against liquid loss or ingress of air. Mounting fixtures (not shown) are provided for the heat generating electronic component 185. The fins 65 of the first conduction surface 71 and fins 183 of the second conduction surface 186 face the circuit board 75. In some cases, components of significant size may be present on both sides of the board, as shown. Alternatively (but not as shown), components of significant size may be only present on one side of the board. A small gap is provided between the ends of the fins 65 and the ends of fins 183 and the components. The fins have an elongated cross-section and their height varied, so as to maintain a small gap between the variously sized components on the electronic circuit board and the tops of the fins. This is shown for both fins 65 and fins 183 in FIG. 14.

For the first cold plate 60, the first cover plate 78 allows first channels 61 to be defined. These allow liquid flow for a second liquid coolant (distinct from the liquid coolant within the volume defined by the sealed module), which is used for heat transfer away from the sealable module 170. Similarly, the second cover plate 187 creates second channels 181 for a third liquid coolant to flow and thereby convey heat away from the sealable module 170 through an independent path. The second and third liquid coolants are independently controlled, so as to provide two isolated heat sinks for the sealable module 170.

Further design and implementation features of this embodiment may be added or adjusted in accordance with the details disclosed previously published WO-2010/130993 and US-2010/0290190.

Although an embodiment has been described, the skilled person will understand that various variations and modifications may be made. For example, although the embodiment shown in FIG. 14 uses two separate cold plates, other types of heat exchangers can be employed. Similarly, whilst there will be understandable advantages from the construction shown in FIG. 14, in which the two heat exchangers are provided on opposite walls of the sealable module, it will be understood that the heat exchangers may alternatively be implemented in the same wall, or adjacent walls. An embodiment along these lines is described below. Equivalently, it will be understood that each heat exchanger need not take up the whole of a wall of the sealable module, but could form part of a wall. In fact, more than two heat exchangers might be provided in some embodiments.

Figure 14:
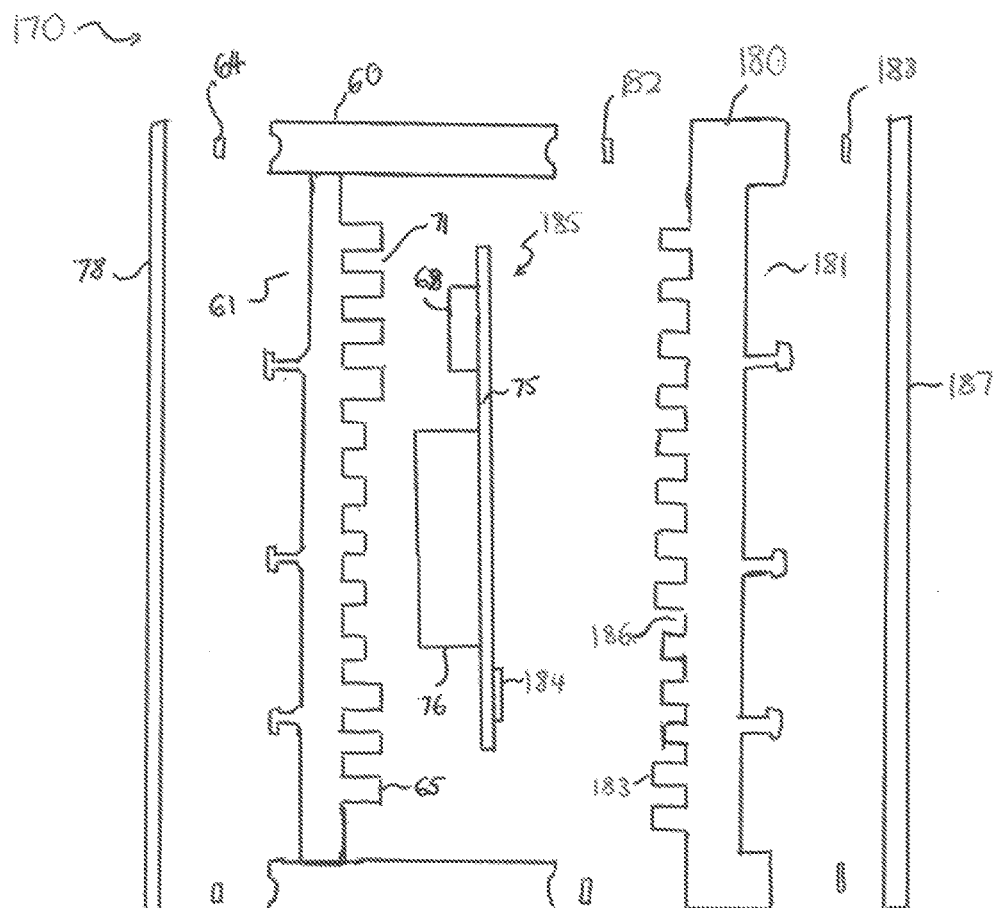
FIG. 14 is a cross-sectional exploded view of an embodiment of a sealable module comprising a heat generating electronic component in accordance with the schematic diagram of FIG. 13.

With reference to FIG. 14, the first conduction surface 71, second conduction surface 186 or both need not be provided with fins 65 or fins 183, and alternatives that would be well known to the skilled person are also possible. Moreover, the fins on one or both conduction surfaces need not have shapes, sizes or both that are adapted in accordance with a shape of the electronic component.

Although a housing that is separate from the first cold plate 60 and second plate 180 is not shown in FIG. 14, it will be understood that this is possible as well as various other structural configurations involving cold plates and integrated or distinct housings. Whilst the heat sink for the first heat exchanger and heat sink for the second heat exchanger take the form of liquid coolants in the embodiment in shown in FIG. 14, it will be appreciated that other kinds of heat sinks may be used.

Further alternative embodiments are now briefly described at a schematic level. The skilled person will appreciate that further implementation details of such embodiments may be similar to the embodiment described above or similar to other known arrangements.

Figure 15:
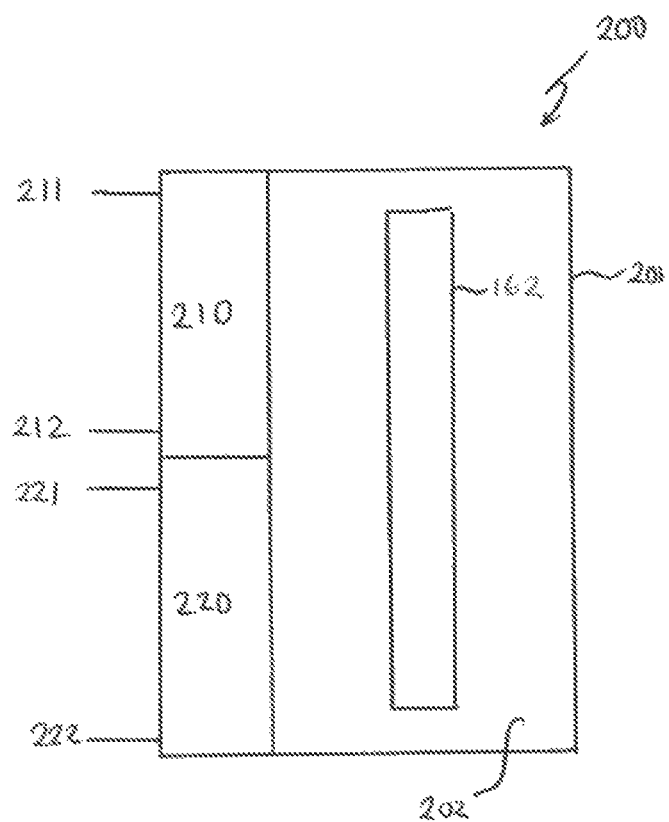
FIG. 15 is a schematic diagram of a cooling apparatus with additional redundancy as an alternative to that shown in FIGS. 13 and 14.

Referring to FIG. 15, there is shown a schematic diagram of an alternative cooling apparatus. Where the same features are shown as in other drawings, the same reference numerals have been used. The cooling apparatus 200 comprises: a housing 201; a heat generating electronic component 162; a first heat exchanger 210; and a second heat exchanger 220. The volume defined by the housing 201, a first heat exchanger 210 and a second heat exchanger 220 is filled with a liquid coolant 202. The first heat exchanger 210 has a coolant input 211 and a coolant output 212 and the second heat exchanger 220 has a coolant input 221 and a coolant output 222, separate from those of the first heat exchanger 210.

This cooling apparatus 200 operates in a similar fashion to the cooling apparatus 160 shown in FIG. 13. During operation, the heat generating electronic component 162 heats the liquid coolant in the volume 202 and heat is transferred from the liquid coolant to heat sinks exterior the sealable module 200 via the first heat exchanger 210 and the second heat exchanger 220. The respective heat sinks for the first and second heat exchangers are isolated from another. The first heat exchanger 210 and the second heat exchanger 220 are arranged on the same side of the heat generating electronic component 162 and make up part of the same wall of the volume that they define together with the housing.

Figure 16:
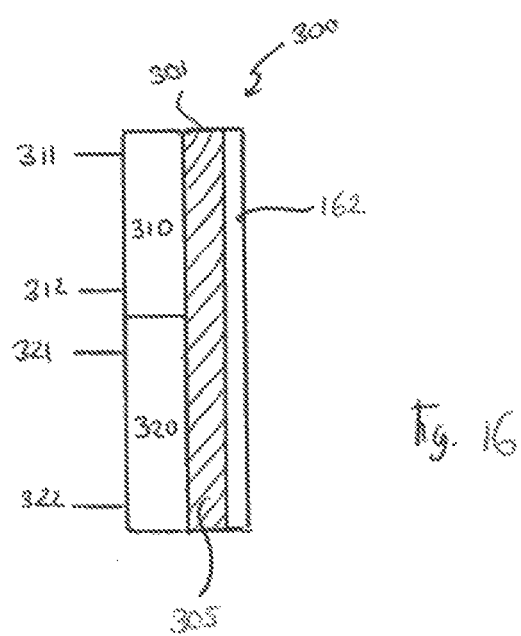
FIG. 16 is a schematic diagram of a cooling apparatus with additional redundancy as an alternative to that shown in FIGS. 13, 14 and 15.

Referring next to FIG. 16, there is shown a schematic diagram of a further alternative cooling apparatus. Again, the same features as shown in other drawings are indicated by identical reference numerals. The cooling apparatus 300 comprises: a heat generating electronic component 162; a first heat exchanger 310; a second heat exchanger 320; a housing 301; and a wicking material 305. The housing 301 and the wicking material 305 together define a vapour chamber attached to the heat generating electronic component 162.

The first heat exchanger 310 has a coolant input 311 and a coolant output 312 and the second heat exchanger 320 has a coolant input 321 and a coolant output 322, separate from those of the first heat exchanger 310. Thus, the first heat exchanger 310 and the second heat exchanger 320 (which are typically separate cold plates) act in parallel and each can provide redundancy should the other fail.

Referring now to FIG. 17, there is shown a schematic diagram of a yet further alternative cooling apparatus. Once more, where the same features are shown as in other drawings, these are indicated by identical reference numerals. The cooling apparatus 400 comprises: a heat generating electronic component 162; a conductive fixing material 405; and a heat exchanger 410. The heat generating electronic component 162 has raised parts (for example, where the heat generating electronic component 162 is a circuit board, it may have components mounted upon it) comprising: a first component 106 and a second component 107. The conductive fixing material 405 is a bonding material which also acts as a thermal interface to conduct heat from the heat generating electronic component 162 to the heat exchanger 410.

The heat exchanger 410 differs from previously described heat exchangers. It is a cold plate with two separate coolant inlets: first inlet 411 and second inlet 412. It also has two separate coolant outlets: first outlet 421 and second outlet 422. Within heat exchanger 410, there are two separate, isolate channels through which two separate flows of coolant are defined: a first flow from first inlet 411 to first outlet 421; and a second flow from second inlet 412 to second outlet 422. These two flows are isolated from one another and therefore act as two parallel heat sinks for the heat exchanger 410. This provides redundancy, such that failure of one flow can be compensated by the other. In order for the transfer of heat from the heat generating electronic component 162 to the two coolant channels to be balanced (and avoid placing a much greater load on one channel than the other), the two channels may be provided to cross over one another in three dimensions, such as using a helical (or spiral) form. The two channels may thereby cover the entire surface of the heat exchanger 410 adjacent the heat generating electronic component 162 (referred to as the conduction surface above) Without such adaptations, a situation may arise if one channel fails that the other channel may not have sufficient thermal capacity to cope with the heat transfer required across the whole heat transfer surface.

Although this embodiment has been described with a conductive thermal interface between the heat generating electronic component 162 and the heat exchanger 410, it will be recognised that it can equally be implemented with a convective thermal interface. This might be implemented by use of a coolant-filled volume, as described with reference to FIGS. 13 to 15. Also, it will be understood that individual features from the different embodiments can also be combined as appropriate to gain advantage from the specific benefits discussed above.

The invention claimed is:

1. A cooling apparatus configured to carry heat removed from an electronic device, the cooling apparatus comprising:
    a first-stage heat exchanger arrangement comprising:
        a first volume for receiving an electronic device and a first liquid coolant;
        a first heat sink in direct physical contact with the first volume;
        a second heat sink in direct physical contact with the first volume and not in direct physical contact with the first heat sink;
        a first channel in direct physical contact with the first heat sink for receiving a second liquid coolant; and
        a second channel in direct physical contact with the second heat sink for receiving a third liquid coolant;
        wherein the first volume is not in fluid communication with the first channel or the second channel;
    wherein the first-stage heat exchanger is configured to:
        receive the first liquid coolant,
        transfer heat from the first liquid coolant to the first heat sink, which is configured to transfer heat to the second liquid coolant, and
        transfer heat from the first liquid coolant to the second heat sink, which is configured to transfer heat to the third liquid coolant; and
    a second-stage heat exchanger arrangement comprising:
        a first liquid flow circuit configured to receive a mixture of the second liquid coolant and the third liquid coolant; and
        a second liquid flow circuit that is not in fluid communication with the first liquid flow circuit;
    wherein the second-stage heat exchanger arrangement is configured to transfer heat from the mixture of the second and third liquid coolants to a liquid in the second liquid flow circuit.

2. The cooling apparatus of claim 1, wherein the first-stage heat exchanger arrangement, in the event that the first-stage heat exchanger arrangement is unable to transfer heat from the first liquid coolant to the first heat sink, is configured to transfer the heat to the second heat sink.

3. The cooling apparatus of claim 1, further comprising:
    a sealable module that defines the first volume and the first liquid coolant.

4. The cooling apparatus of claim 3, wherein the sealable module comprises a housing, and the first heat exchanger comprises a first conduction surface that cooperates with the housing so as to define at least part of the volume.

5. The cooling apparatus of claim 4, wherein the first heat exchanger further defines the first channel for receiving the second liquid coolant, the first conduction surface separating the first volume and the first channel to allow conduction of heat between the volume and the first channel through the first conduction surface.

6. The cooling apparatus of claim 4, further comprising the electronic component and wherein at least a portion of the first conduction surface or housing is shaped in conformity with the shape of the at least one electronic component.

7. The cooling apparatus of claim 4, wherein the first-stage heat exchanger comprises a second conduction surface that cooperates with the housing so as to define at least part of the volume.

8. The cooling apparatus of claim 7, wherein the second conduction surface separates the volume and the second channel to allow conduction of heat between the volume and the second channel through the second conduction surface.

9. The cooling apparatus of claim 7, further comprising the electronic device and wherein at least a portion of the second conduction surface or housing is shaped in conformity with the shape of the electronic device.

10. The cooling apparatus of claim 7, wherein the housing and the first and second conduction surfaces define the volume.

11. The cooling apparatus of claim 10, further comprising the electronic device having an axis of elongation and wherein the first and second conduction surfaces each have respective axes of elongation that are substantially parallel to the axis of elongation of the electronic device.

12. The cooling apparatus of claim 1, wherein the electronic device comprises a circuit board, defining a substantially planar form.

13. The cooling apparatus of claim 1, further comprising:
a piping system for receiving the first liquid coolant, the piping system being arranged to separate the first liquid coolant into first and second portions to transfer the first and second portions of the first liquid coolant to the first-stage heat exchanger arrangement.

14. The cooling apparatus of claim 13, wherein the first-stage heat exchanger arrangement comprises:
a first heat exchanger, arranged to receive a first portion of the first liquid coolant and to transfer heat from the first portion of the first liquid coolant to the first heat sink; and
a second heat exchanger, arranged to receive a second portion of the first liquid coolant and to transfer heat from the second portion of the first liquid coolant to the second heat sink.

15. The cooling apparatus of claim 14, further comprising:
a first coolant pump, arranged to pump the first portion of the first liquid coolant in the piping system; and
a second coolant pump, arranged to pump the second portion of the first liquid coolant, independently from the first coolant pump.

16. The cooling system of claim 1, further comprising:
a first outer pump, arranged to pump the second liquid coolant; and
a second outer pump, arranged to pump the third liquid coolant, independently from the first outer pump.

17. The cooling system of claim 13, further comprising:
a zero-stage heat exchanger arrangement, configured to transfer heat generated by the electronic device to the first liquid coolant; and
wherein the piping system is arranged to receive the first liquid coolant from the zero-stage heat exchanger arrangement.

18. The cooling system of claim 17, further comprising:
a plurality of sealable modules, each defining an internal volume in which a respective electronic device is located, each sealable module further comprising a respective zero-stage heat exchanger configured to transfer heat generated by the respective electronic device to the first liquid coolant, such that the zero-stage heat exchanger arrangement comprises the respective zero-stage heat exchanger of each of the plurality of sealable modules.

19. The cooling system of claim 18, wherein the plurality of sealable modules are housed in a cabinet.

20. The cooling system of claim 19, wherein the heat exchanger arrangement is also housed in the cabinet.

21. A method of operating a cooling system, comprising:
receiving a first liquid coolant at a first-stage heat exchanger arrangement, so as to transfer heat from the first liquid coolant to a first heat sink and to a second heat sink, wherein the first and second heat sinks are distinct from one another and transfer heat to a second liquid coolant and a third liquid coolant, respectively; and
receiving the second and third liquid coolants at a second-stage heat exchanging arrangement; and
transferring heat from the second and third liquid coolants to a common output heat sink using the second-stage heat exchanging arrangement.

22. The method of claim 21, further comprising:
operating the electronic device in a volume defined by a sealable module, the first liquid coolant also being located within the volume, such that the first liquid coolant can remove heat generated by the electronic device;
wherein a first portion of the first liquid coolant is received by a first heat exchanger at a first part of the volume and a second portion of the first liquid coolant is received by a second heat exchanger at a second part of the volume.

23. The method of claim 21, further comprising:
receiving the first liquid coolant in a piping system;
separating first and second portions of the first liquid coolant in the piping system;
transferring the first and second portions of the first liquid coolant to first and second heat exchangers respectively using the piping system.

24. The method of claim 23, further comprising:
transferring heat generated by the electronic device to the first liquid coolant using a zero-stage heat exchanger arrangement; and
wherein the step of receiving the first liquid coolant in the piping system comprises receiving the first liquid coolant from the zero-stage heat exchanger arrangement.

25. The method of claim 24, further comprising:
operating each of a plurality of electronic devices within an internal volume of a respective sealable module;
transferring heat generated by each electronic device to the first liquid coolant using a respective zero-stage heat exchanger that forms part of the respective sealable module, such that the zero-stage heat exchanger arrangement comprises the respective zero-stage heat exchanger of each of the plurality of sealable modules.

26. The cooling apparatus of claim 1, wherein at least one of the first heat sink and the second heat sink is a cold plate.

27. The cooling apparatus of claim 1, further comprising a header tank configured to regulate pressure of the second cooling liquid.

28. The method of claim 21, further comprising, in the event that the first-stage heat exchanger arrangement is unable to transfer heat from the first liquid coolant to the first heat sink:
  transferring at least some of the heat from the first liquid coolant to the second heat sink at the first-stage heat exchanger arrangement.

* * * * *